US012251697B2

(12) United States Patent
Dudukovic et al.

(10) Patent No.: US 12,251,697 B2
(45) Date of Patent: Mar. 18, 2025

(54) SYSTEMS AND METHODS FOR REACTION AND TRANSPORT ENGINEERING VIA CELLULAR FLUIDICS

(71) Applicant: Lawrence Livermore National Security, LLC, Livermore, CA (US)

(72) Inventors: Nikola Dudukovic, Hayward, CA (US); Sarah Baker, Dublin, CA (US); James Timothy Cahill, Livermore, CA (US); Jonathan Tesner Davis, Oakland, CA (US); Joshua R. Deotte, Livermore, CA (US); Karen Ruth Dubbin, Hayward, CA (US); Eric B. Duoss, Danville, CA (US); Erika Jo Fong, San Ramon, CA (US); Hawi Bacha Gemeda, San Leandro, CA (US); Fang Qian, Santa Cruz, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 953 days.

(21) Appl. No.: 17/097,480

(22) Filed: Nov. 13, 2020

(65) Prior Publication Data

US 2021/0077999 A1 Mar. 18, 2021

Related U.S. Application Data

(63) Continuation-in-part of application No. PCT/US2020/047424, filed on Aug. 21, 2020, which (Continued)

(51) Int. Cl.

*B01L 3/00* (2006.01)
*B29C 64/129* (2017.01)

(52) U.S. Cl.

CPC ...... *B01L 3/502707* (2013.01); *B29C 64/129* (2017.08); *B01L 2200/0678* (2013.01);

(Continued)

(58) Field of Classification Search

None

See application file for complete search history.

(56) References Cited

U.S. PATENT DOCUMENTS 5,545,280 A * 8/1996 Wenz .................. G02F 1/13394 156/291
6,146,892 A * 11/2000 Ma .......................... A61L 27/56 435/246

(Continued)

FOREIGN PATENT DOCUMENTS

CN 107261996 A 10/2017
WO WO-2017142867 A1 8/2017

OTHER PUBLICATIONS

Definition of "fluid" from Merriam-Webster Dictionary, retrieved from https://web.archive.org/web/20140213150024/https://www.merriam-webster.com/dictionary/fluid (Year: 2014).

(Continued)

*Primary Examiner* — Brian R Gordon

(74) *Attorney, Agent, or Firm* — HARNESS, DICKEY & PIERCE, P.L.C.

(57) ABSTRACT

The present disclosure relates to an engineered, additively manufactured, microfluidic cellular structure formed from a plurality of cells, wherein the cells are each formed from a plurality of interconnected elements. The cells have voids and each cell is open at upper ends thereof. The cells each communicate at a point below its upper end with a common channel. The cells are each configured to accept a fluid and operate to channel the fluid into the common channel and to hold the fluid received therein for later selective withdrawal from the structure.

9 Claims, 14 Drawing Sheets

Related U.S. Application Data is a continuation of application No. 16/549,543, filed on Aug. 23, 2019.

(52) U.S. Cl.
CPC .................. *B01L 2300/0877* (2013.01); *B01L 2300/0893* (2013.01); *B01L 2300/12* (2013.01); *B01L 2300/1805* (2013.01); *B01L 2400/0406* (2013.01); *B01L 2400/086* (2013.01); *B01L 2400/088* (2013.01); *Y10T 428/249953* (2015.04)

(56) References Cited

U.S. PATENT DOCUMENTS

| | | | | |
|---|---|---|---|---|
| 6,645,432 | B1 | 11/2003 | Anderson et al. | |
| 6,673,285 | B2 * | 1/2004 | Ma | B01J 20/305 29/527.1 |
| 7,503,833 | B2 * | 3/2009 | Muldowney | B24B 37/26 451/527 |
| 7,517,277 | B2 * | 4/2009 | Muldowney | B24B 37/22 451/529 |
| 7,527,671 | B1 * | 5/2009 | Stuecker | B01D 39/2086 264/DIG. 48 |
| 7,604,529 | B2 * | 10/2009 | Muldowney | B24B 37/26 451/527 |
| 7,635,291 | B2 * | 12/2009 | Muldowney | B24B 37/26 451/527 |
| 8,721,959 | B2 * | 5/2014 | Dry | B32B 9/02 264/552 |
| 8,920,879 | B2 * | 12/2014 | Toohey | B29C 73/22 427/385.5 |
| 9,597,837 | B1 | 3/2017 | Cesarano, III et al. | |
| 10,967,352 | B1 * | 4/2021 | McCulloch | B01L 3/502753 |
| 11,130,131 | B2 | 9/2021 | Deotte et al. | |
| 11,498,124 | B1 * | 11/2022 | Sanders | B22F 3/1115 |
| 11,780,984 | B2 * | 10/2023 | Kendall | B01L 3/502 521/64 |
| 2004/0226620 | A1 | 11/2004 | Therriault et al. | |
| 2006/0091051 | A1 | 5/2006 | Takada et al. | |
| 2006/0235105 | A1 * | 10/2006 | Gratson | B33Y 70/00 523/160 |
| 2006/0245987 | A1 * | 11/2006 | Schmidt | B01J 19/249 422/198 |
| 2008/0176272 | A1 | 7/2008 | Bergman et al. | |
| 2013/0056912 | A1 | 3/2013 | O'Neill et al. | |
| 2013/0143060 | A1 | 6/2013 | Jacobsen et al. | |
| 2013/0264749 | A1 | 10/2013 | Jones et al. | |
| 2013/0273347 | A1 | 10/2013 | Jacobsen et al. | |
| 2016/0139102 | A1 | 5/2016 | McCord et al. | |
| 2016/0151982 | A1 | 6/2016 | Sand | |
| 2016/0282338 | A1 | 9/2016 | Miklas et al. | |
| 2017/0151584 | A1 | 6/2017 | Wiesner et al. | |
| 2017/0351175 | A1 | 12/2017 | Hansson et al. | |
| 2018/0208467 | A1 * | 7/2018 | Ye | C01B 32/184 |
| 2019/0145298 | A1 | 5/2019 | Abu Al-Rub et al. | |
| 2019/0152139 | A1 | 5/2019 | Ulichney et al. | |
| 2019/0299290 | A1 * | 10/2019 | Kuhns | B22F 10/38 |
| 2019/0321915 | A1 * | 10/2019 | Pawlowski | B33Y 70/00 |
| 2020/0206384 | A1 * | 7/2020 | Chow | B33Y 70/00 |
| 2020/0276783 | A1 | 9/2020 | Berger | |
| 2021/0053056 | A1 | 2/2021 | Dudukovic et al. | |
| 2021/0077999 | A1 | 3/2021 | Dudukovic et al. | |
| 2021/0094036 | A1 * | 4/2021 | Deotte | C12M 33/00 |
| 2021/0246575 | A1 * | 8/2021 | Yadavalli | D01D 5/06 |
| 2021/0369912 | A1 * | 12/2021 | Toro Estrella | B33Y 10/00 |
| 2022/0314209 | A1 * | 10/2022 | Kennema | B22F 3/1115 |
| 2022/0401799 | A1 * | 12/2022 | DeMille | A63B 53/0437 |
| 2022/0403102 | A1 * | 12/2022 | Kabaria | C08G 63/08 |
| 2023/0347595 | A1 * | 11/2023 | Michielsen | B33Y 50/02 |
| 2023/0395812 | A1 * | 12/2023 | Mohanram | H01M 4/861 |

OTHER PUBLICATIONS

International Search Report and Written Opinion regarding International Application No. PCT/US2020/047424, dated Dec. 2, 2020.

J. Berthier, K. A. Brakke, and E. Berthier, "A general condition for spontaneous capillary flow in uniform cross-section microchannels," Microfluid Nanofluid, vol. 16, No. 4, pp. 779-785, Apr. 2014, doi: 10.1007/s10404-013-1270-1.

R. S. Hale, R. Ranjan, and C. H. Hidrovo, "Capillary flow through rectangular micropillar arrays," International Journal of Heat and Mass Transfer, vol. 75, pp. 710-717, Aug. 2014, doi: 10.1016/j.ijheatmasstransfer.2014.04.016.

S. Das, H. V. Patel, E. Milacic, N. G. Deen, and J. a. M. Kuipers, "Droplet spreading and capillary imbibition in a porous medium: A coupled IB-VOF method based numerical study," Physics of Fluids, vol. 30, No. 1, p. 012112, Jan. 2018, doi: 10.1063/1.5010716.

J. Cai, E. Perfect, C.-L. Cheng, and X. Hu, "Generalized Modeling of Spontaneous Imbibition Based on Hagen—Poiseuille Flow in Tortuous Capillaries with Variably Shaped Apertures," Langmuir, vol. 30, No. 18, pp. 5142-5151, May 2014, doi: 10.1021/la5007204.

T. Gambaryan-Roisman, "Liquids on porous layers: wetting, imbibition and transport processes," Current Opinion in Colloid & Interface Science, vol. 19, No. 4, pp. 320-335, Aug. 2014, doi: 10.1016/j.cocis.2014.09.001.

P. Randive, A. Dalal, and P. P. Mukherjee, "Mesoscopic Modeling of Capillarity-Induced Two-Phase Transport in a Microfluidic Porous Structure," Transp Porous Med, vol. 122, No. 3, pp. 673-691, Apr. 2018, doi: 10.1007/s11242-018-1020-7.

J. Berthier et al., "On the halt of spontaneous capillary flows in diverging open channels," Medical Engineering & Physics, vol. 48, pp. 75-80, Oct. 2017, doi: 10.1016/j.medengphy.2017.05.005.

M. Prakash, D. Quere, and J. W. M. Bush, "Surface Tension Transport of Prey by Feeding Shorebirds: The Capillary Ratchet," Science, vol. 320, No. 5878, pp. 931-934, May 2008, doi: 10.1126/science.1156023.

M. Liu, S. Suo, J. Wu, Y. Gan, D. AH Hanaor, and C. Q. Chen, "Tailoring porous media for controllable capillary flow," Journal of Colloid and Interface Science, vol. 539, pp. 379-387, Mar. 2019, doi: 10.1016/j.jcis.2018.12.068.

International Search Report and Written Opinion regarding International Patent Application No. PCT/US2021/059151, dated Mar. 4, 2022.

Dudukovic, Nikola A. et al., Cellular fluidics, Nature, 2021, vol. 595, pp. 58-65 and additional information pp. 1-13 (Online publication date: Jun. 30, 2021) pp. 58-65.

* cited by examiner

3D Channel Splitter Design:

SYSTEMS AND METHODS FOR REACTION AND TRANSPORT ENGINEERING VIA CELLULAR FLUIDICS

CROSS-REFERENCE TO RELATED APPLICATIONS

This application is a continuation-in-part application and claims priority of International Patent Application PCT/US2020/047424, filed Aug. 21, 2020, which claims priority to U.S. patent application Ser. No. 16/549,543, filed on Aug. 23, 2019. The entire disclosures of the above applications are incorporated herein by reference.

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates generally to microfluidics and millifluidics, and more particularly to systems and methods for facilitating open cell lattices for engineering transport phenomena and chemical reactions, which provide desired flow properties.

BACKGROUND

The statements in this section merely provide background information related to the present disclosure and may not constitute prior art.

A growing area of importance in the field of fluidic devices involves is obtaining even greater levels of control over chemical reactions at interfaces with a structure, as well as obtaining even greater control over heat and mass transport at interfaces within a structure. Obtaining greater levels of control at interfaces may be important for chemical reactions, as well as heat and mass transport, in various types of devices such as electrochemical devices, thermochemical devices, bio-reactor devices, batteries, fuel cells, etc., which often involve the application of micro-fluidics. Conventional microfluidics are typically limited to actively-pumped fluid transport in enclosed microchannels, and typically are limited to structures having in a planar configuration. More advanced microfluidic structures, which enable degrees of control over chemical reactions, as well as heat and mass transfer, at interfaces within the structure, would potentially open up new possibilities in chemical/process engineering applications.

SUMMARY

This section provides a general summary of the disclosure, and is not a comprehensive disclosure of its full scope or all of its features.

In one aspect the present disclosure relates to an engineered cellular fluidics structure. The structure may comprise a plurality of tessellated cells formed from a plurality of interconnected elements, with the interconnected elements formed from a curable resin. The interconnected elements form voids within each cell. The voids communicate with one another, and the elements are formed such that the voids have a non-uniform dimension to create a varying porosity within the structure.

In another aspect the present disclosure relates to an engineered cellular fluidics structure. The structure may comprise a plurality of tessellated cells formed from a plurality of interconnected struts, with the interconnected struts formed from a curable resin. The interconnecting struts form voids within each cell, with the struts being formed such that the voids have a non-uniform dimension and communicate with one another to create a varying porosity within the structure. The structure is constructed using a material which forms a catalyst to create solid-liquid-gas interfaces at each of the voids within the structure.

In still another aspect the present disclosure relates to a method for forming an engineered cellular fluidics structure. The method may comprise using a substrate material to form a plurality of tessellated cells, the cells being defined in part by a plurality of interconnected struts. The method may further include forming the plurality of tessellated cells such that the interconnected struts define a plurality of voids in the plurality of tessellated cells, with the voids being in flow communication with one another. The method may further include forming the plurality of tessellated cells such that at least a subplurality of the voids have different dimensions, to create a varying porosity within the structure.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

The present disclosure relates broadly to the design, fabrication and use of open cell lattices for facilitating engineering transport phenomena and chemical reactions. Such structures may also be understood as “engineered cellular fluidic structures”, as they are designed with the intent of controlling fluid flow, gas flow, or a combination of fluid/gas flow, through capillary action. The architecture of the structures constructed using the teachings presented herein are “engineered” in the sense that the fluidic structures are constructed in a highly defined manner in accordance with a CAD construction, and typically with a curable resin, to optimize important performance characteristics. Such performance characteristics may include control over porosity of the structure and capillary forces to provide desired flow properties including one or more desired capillary flow channels, as well as control over multi-phase interfaces and other functionalities that are important with microfluidic structures or devices.

The cellular fluidic structures of the present disclosure can be produced by additive manufacturing methods, for example and without limitation, via projection microstereolithography or two photon lithography. The use of additive manufacturing techniques to form the lattice structures of the various embodiments disclosed herein may be combined with other fabrication and processing techniques including, without limitation, fabrication techniques relating to surface functionalization, catalyst deposition, thermal treatment, removal of sacrificial material, etc. The foregoing manufacturing techniques may be used singly or in combination to achieve desired functionalities. Such desired functionalities may include one of, or combinations of, for example, a desired electric conductivity, a desired thermal conductivity, desired mechanical properties, a desired catalytic activity, or a desired stability, just to name a few important functionalities. By using engineered cellular fluidics, a fluid can be distributed either passively (by capillary action alone) or actively (e.g., by pumping) in an open, three-dimensional configuration. These features offer significant potential for generating new microfluidic devices and related technologies in the field of chemical/process engineering and related devices (e.g., chemical/electrochemical reactors, packed beds, bubble columns, etc.).

Figure 1:
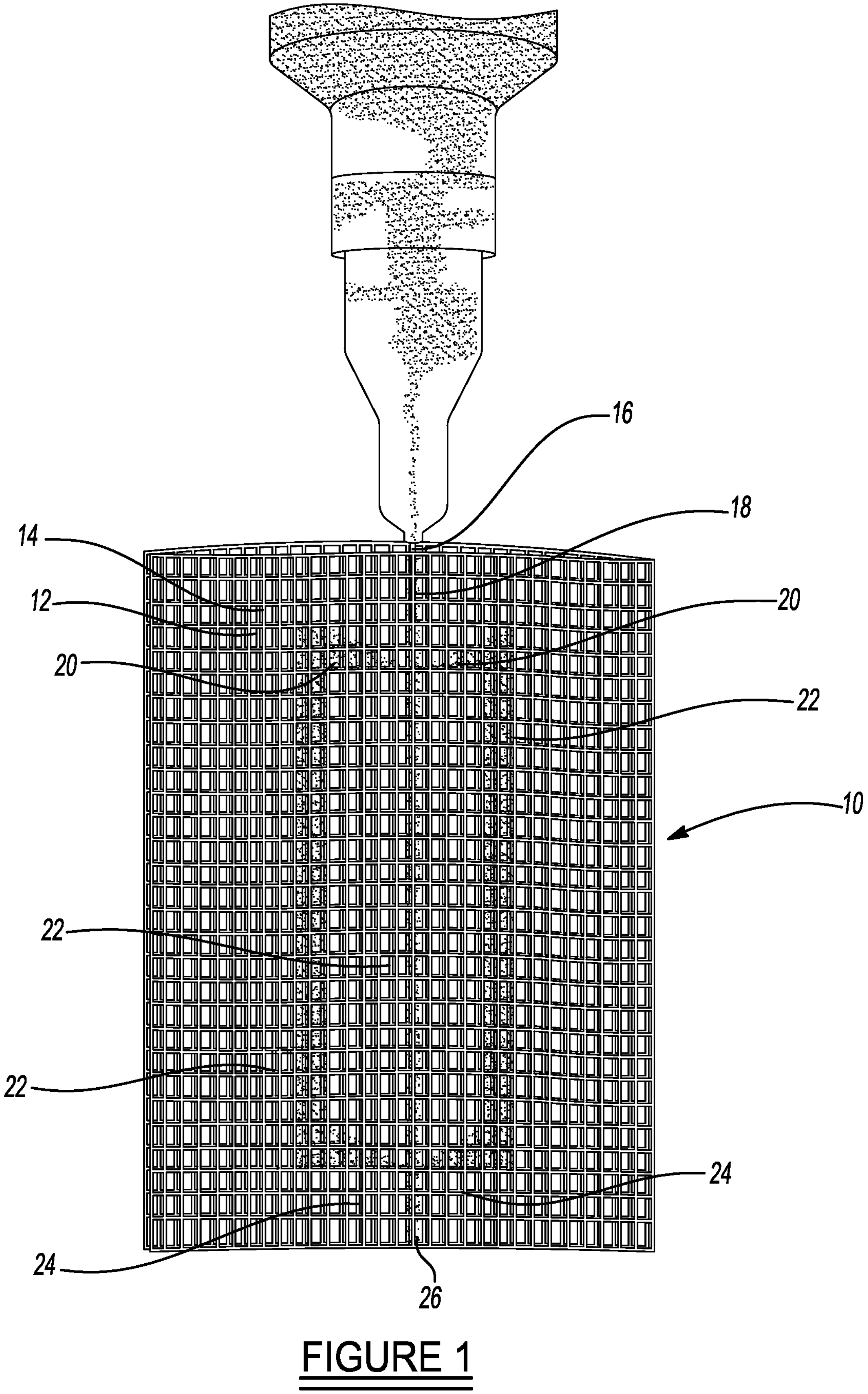
FIG. 1 is a perspective view of a single plane splitter lattice structure in accordance with one embodiment of the present disclosure.

FIG. 1 shows an engineered cellular fluidic structure 10 in accordance with one embodiment of the present disclosure. For convenience, the engineered cellular fluidic structure 10 will be referred to simply as the “lattice” structure 10 throughout the following discussion.

The lattice structure 10 in this example forms a single plane channel splitter which is able to split a fluid flow into several desired paths within a single plane. The lattice structure 10 includes flow defining paths 12 and voids 14 having dimensions which, in this example, are engineered to provide the multi-flow path split seen occurring in the lattice structure 10. The fluid flow is injected or released at one end 16 of the lattice structure 10 and flows through capillary action along path 18 until branching into flows 20, which then propagate in three parallel paths 22 through a length of the lattice structure 10 before being channeled in flows 24 toward a center of the structure, and then re-combined into a single flow channel 26. Accordingly, the various flow channels are all presented within a single plane in this example. The dimensions of the fluid defining paths 12 and the voids 14 are controlled to provide the capillary action that creates these flow paths. While three parallel flow paths 22 are shown, together with one re-combined flow channel 26, it will be appreciated that a greater or lesser number of the flow paths 22 could be created, along with more than one re-combined flow channel 26.

Figure 4:
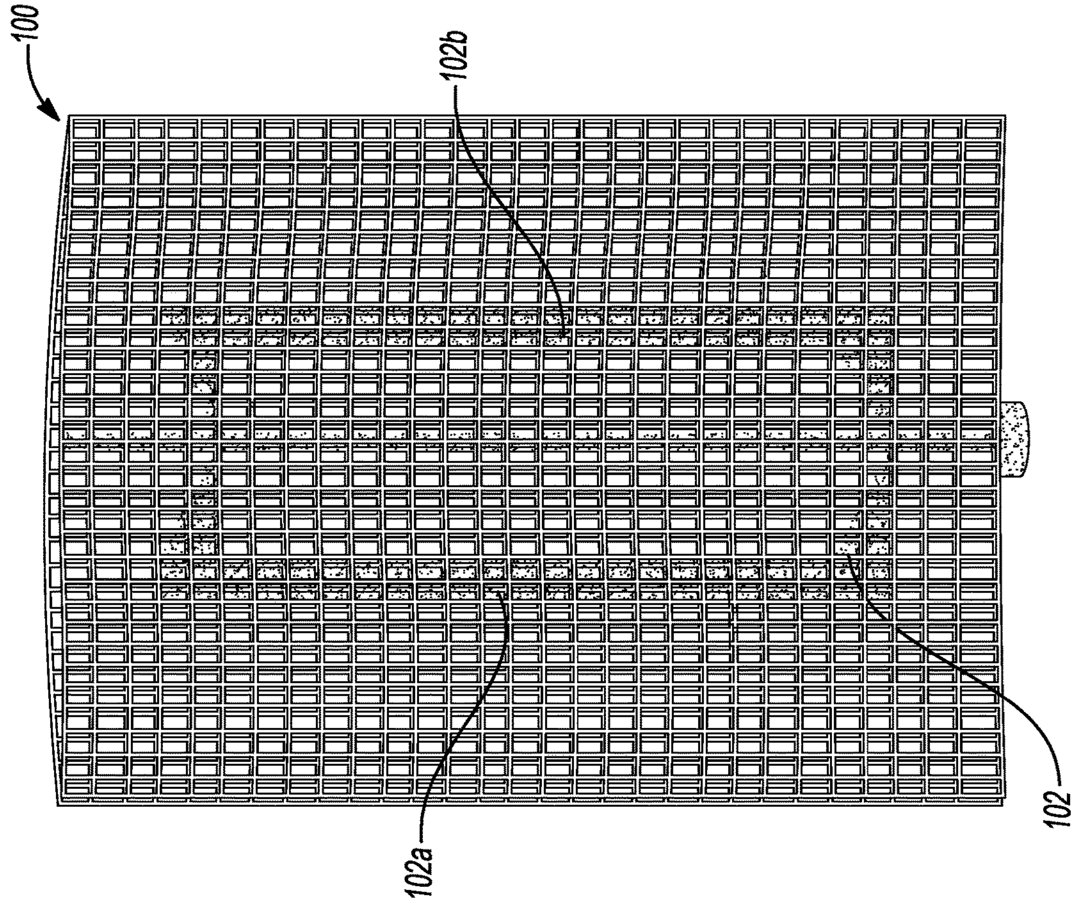
FIG. 4 is a side view of the lattice structure in FIG. 3 taken in accordance with section line 4-4 in FIG. 3 further illustrating the splitting of the capillary flow through the lattice structure.
Figure 2:
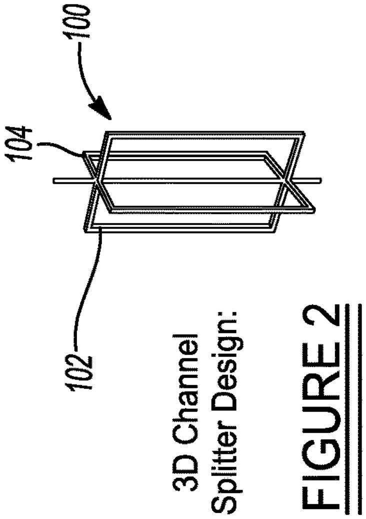
FIG. 2 is a simplified diagrammatic representation of a 3D channel splitter lattice structure.
Figure 3:
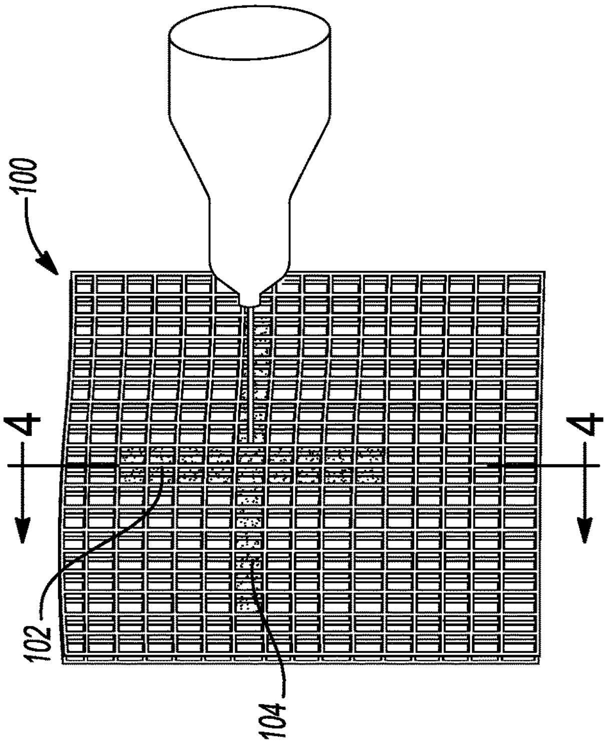
FIG. 3 is a an illustration of a plan (top) view of the 3D structure shown in FIG. 2, with fluid flowing through capillary action in two orthogonal planes into the lattice structure.

FIG. 2 shows a diagrammatic perspective view of a 3D lattice splitter structure 100 design where the fluid flow through the splitter structure occurs in two distinct planes 102 and 104 arranged orthogonal to one another (i.e., in a 3D space). FIG. 3 shows the 3D lattice splitter structure 100 from a plan (top) view, illustrating the intersecting orthogonal flow planes 102 and 104. FIG. 4 shows a side view taken in accordance with section line 4-4 in FIG. 3 showing the plane 102. The plane 102 can be seen to be formed by two parallel paths 102*a* and 102*b*.

While the lattice splitter structure 100 is shown with only two orthogonally arranged flow planes 102 and 104, it will be appreciated that a 3D lattice structure with more than two orthogonal flow planes could just as easily be formed.

For example, a lattice structure with three distinct non-perpendicular flow planes angularly arranged at 120 degrees from another (from a plan view perspective) could be provided.

Figure 5:
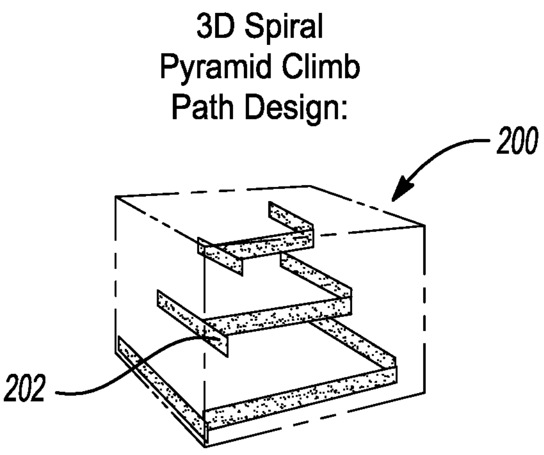
FIG. 5 is a perspective diagrammatic illustration of a 3D spiral flow pattern that may be created in a lattice structure using the teachings of the present disclosure.
Figure 6:
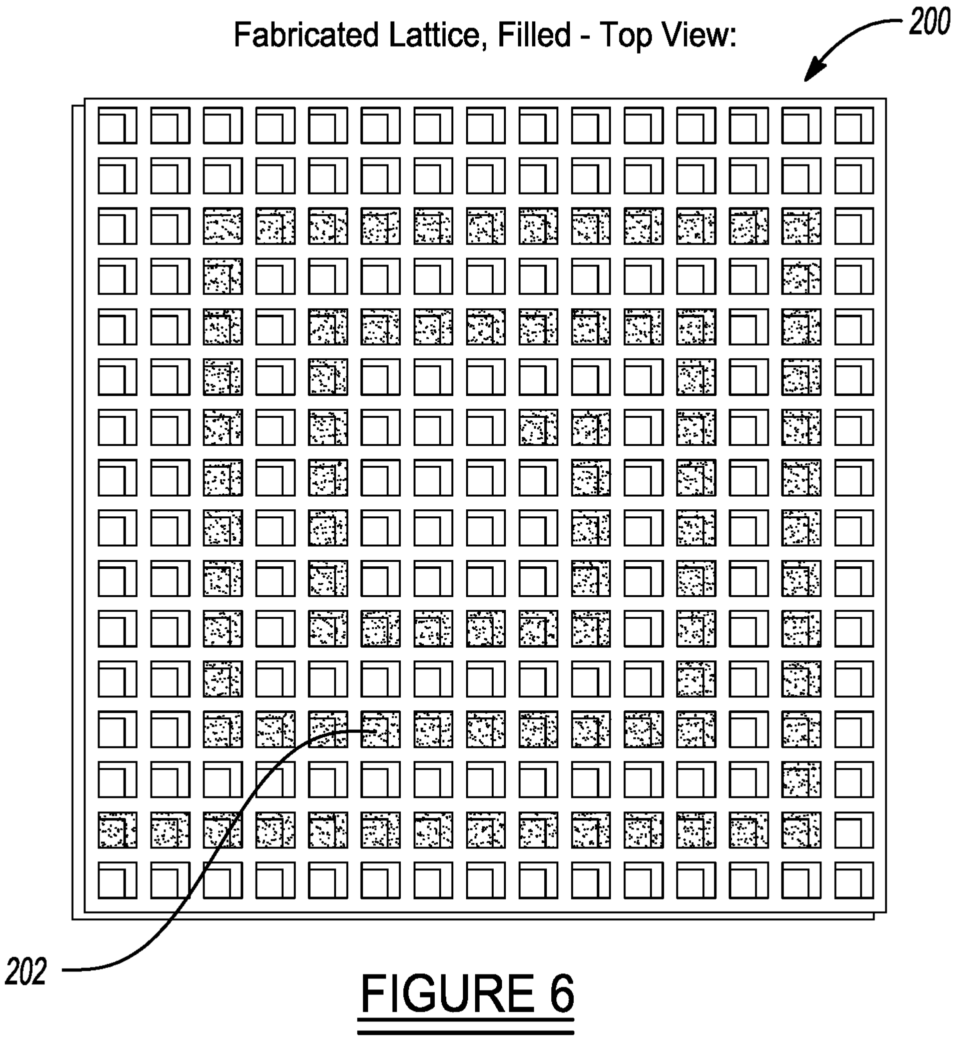
FIG. 6 is a plan (top) view of a lattice structure in accordance with the present disclosure created to provide the 3D spiral flow pattern shown in FIG. 5.

FIGS. 5 and 6 show yet another 3D lattice structure 200 in accordance with another embodiment of the present disclosure. In this example the lattice structure 200 is engineered to provide a spiral, pyramid flow path 202 as indicated in the simplified diagrammatic drawing of FIG. 5. FIG. 6 shows a plan view (top view looking down) onto the lattice structure 200 to further illustrate the spiral, pyramid flow path 202.

Figure 7A:
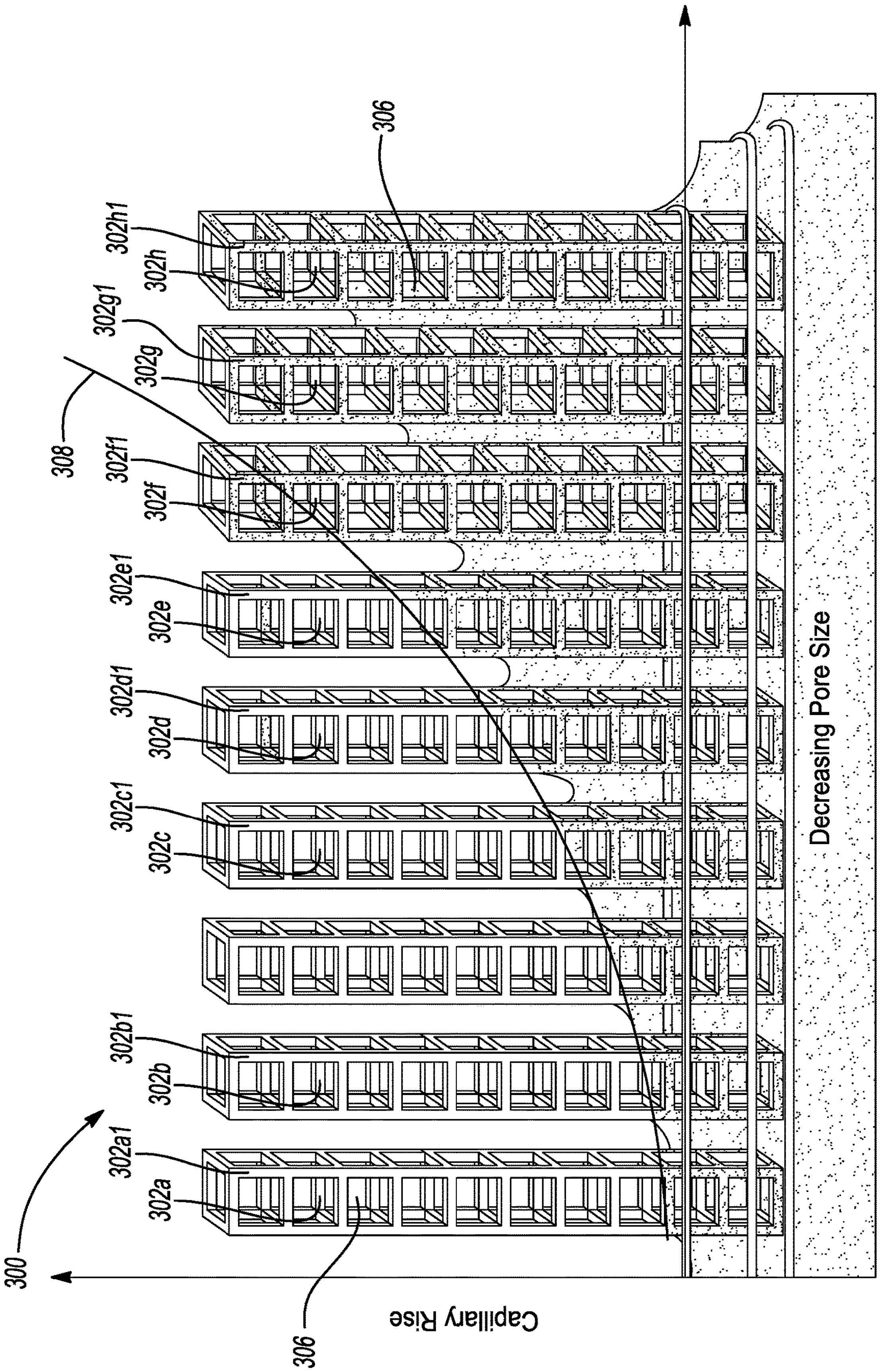
FIG. 7*a* is a side view of a portion of a lattice structure in accordance with the present disclosure, illustrating how the size of the voids (i.e., pores) in each cell of the structure strongly influences the capillary flow characteristics within the structure.
Figure 7B:
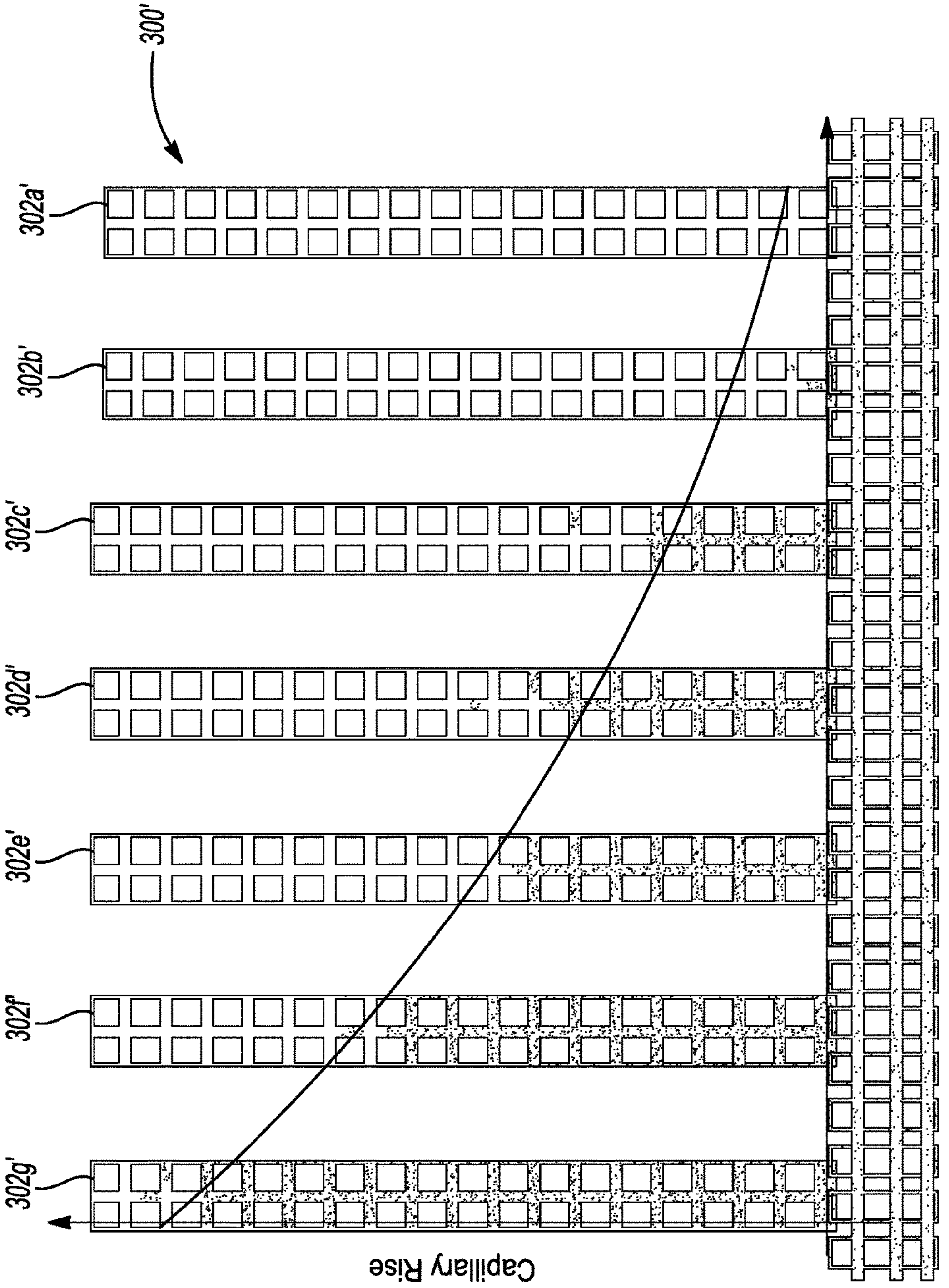
FIG. 7*b* shows a side view of a portion of a lattice structure similar to that shown in FIG. 7*a*, but with the columns further spaced apart from one another, which limits bleed-through of fluid to adjacent columns.

FIG. 7*a* shows a portion of a lattice structure 300 constructed in accordance with one embodiment of the present disclosure to illustrate how the manufacture of the lattice structure 300 controls the capillary flow through cells of the structure. The lattice structure 300 is designed by tessellating one or more types of 3D unit cells in space. In this example the lattice structure 300 includes pluralities of unit cells 302*a*-302*h* formed by interconnecting struts 306, which form voids 302*a*1-302*h*1 in each unit cell. Unit cells 302*a* are disposed adjacent one another to form one column, while unit cells 302*b*-302*h* are also disposed in a like manner to form a plurality of closely adjacently positioned columns. In this example the unit cells 302*a* each have centrally formed voids 302*a*1, while unit cells 10*b*-10*h* each have voids 302*b*1-302*h*1, respectively. The voids 302*a*1 can be seen to be the largest in cross sectional area. The voids 302*b*1 are smaller in cross sectional area than the voids 302*a*1, voids 302*c*1 are smaller than the voids 302*b*1, and so forth, with the voids 302*h*1 being the smallest. Note also that the spacing between adjacent columns of cells decreases from left to right across the lattice structure 300, such that the columns formed by the cells 302*a* and 302*b* are spaced farther apart than columns formed by the unit cells 302*g* and 302*h*. FIG. 7*b* shows a similar lattice structure 300' but with the columns 302*a*'-302*g*' spaced even further apart, which prevents "bleed through" of liquid between adjacent columns. Accordingly, the spacing of the columns of the structures 300 and 300' can also be used to help control the capillary flow of fluid through the lattice structures.

The porosity of the lattice structure 10 can further be controlled by changing one or more parameters, for example, changing the unit cell size of each unit cell 302*a*-302*h* shown in FIG. 7*a* in one or more of the X, Y and/or Z dimensions, or changing the material used to construct the one or more of the unit cells 302*a*-302*h*. Porosity can also be changed by changing dimensions of the struts 306 that are used to form the cells 302*a*-302*g* so as to change the dimensions of the voids 302*a*1-302*h*1. In this example it will be noted that the struts 306 used to form the column of cells 302*a* are considerably thinner than those used to form column of cells 302*h*. The voids 302*a*1-302*h*1 (i.e., the empty space) in each unit cell 302*a*-302*h* influences the capillary flow of the liquid front, and can remain constant or change shape throughout the lattice structure 300. Curve 308 indicates how the porosity of the lattice structure 300 increases as the pore size (dimensions of the voids 302*a*1-302*h*1) increases.

The lattice structure 300 may also contain one or more additional features such as solid walls and surfaces, or selectively located inlets and outlets for fluid flow to enable connecting to microfluidic pumps and other components or devices. The final design of the lattice structure 300, or any of the other embodiments discussed herein, may be generated as a CAD (computer aided design) file.

When the physical lattice 10, 100, 200 or 300 is fabricated from the CAD file, such fabrication may be accomplished, in one example, by additive manufacturing methods such as projection microstereolithography (PuSL) or two photon lithography (2PL), in which a light source is used to selectively polymerize a pattern onto a surface of a photosensitive resin. The process is repeated layer-by-layer for each digital slice of the CAD file (microns to tens of microns in thickness). The photosensitive resin may contain (but is not limited to) one of more of the following components: (1) one or more monomer or polymer species, typically those undergoing light-initiated free radical polymerization (e.g., acrylates, thiolenes), (2) a photoinitiator, (3) a photoabsorber, (4) stabilizers or inhibitors (e.g., 4-methoxyphenol), (5) salts or solid fillers (e.g., catalyst material, sacrificial material, pore formers, nanoparticles for improved mechanical properties), (6) solvents or diluents, (7) other additives (e.g., surfactants, thermal initiators, sintering aids, adhesion promoters, etc.). The fabrication process may also include multiple resins (e.g., a hydrophilic and a hydrophobic polymer) that are selectively cured, as well as a rinsing step between swapping resins, for example by delivering water or solvents to the printed body, or dipping the printed body into a bath.

The fabricated lattice 10/100/200/300 may be cleaned using chemical or physical methods, for example through the use of solvents or through sonication, and may be post-cured. Post-curing may be carried out, for example, by using a UV chamber or similar light source, or by thermal treatment, and further functionalized (e.g., UV/ozone and oxygen plasma treatment).

Figure 8:
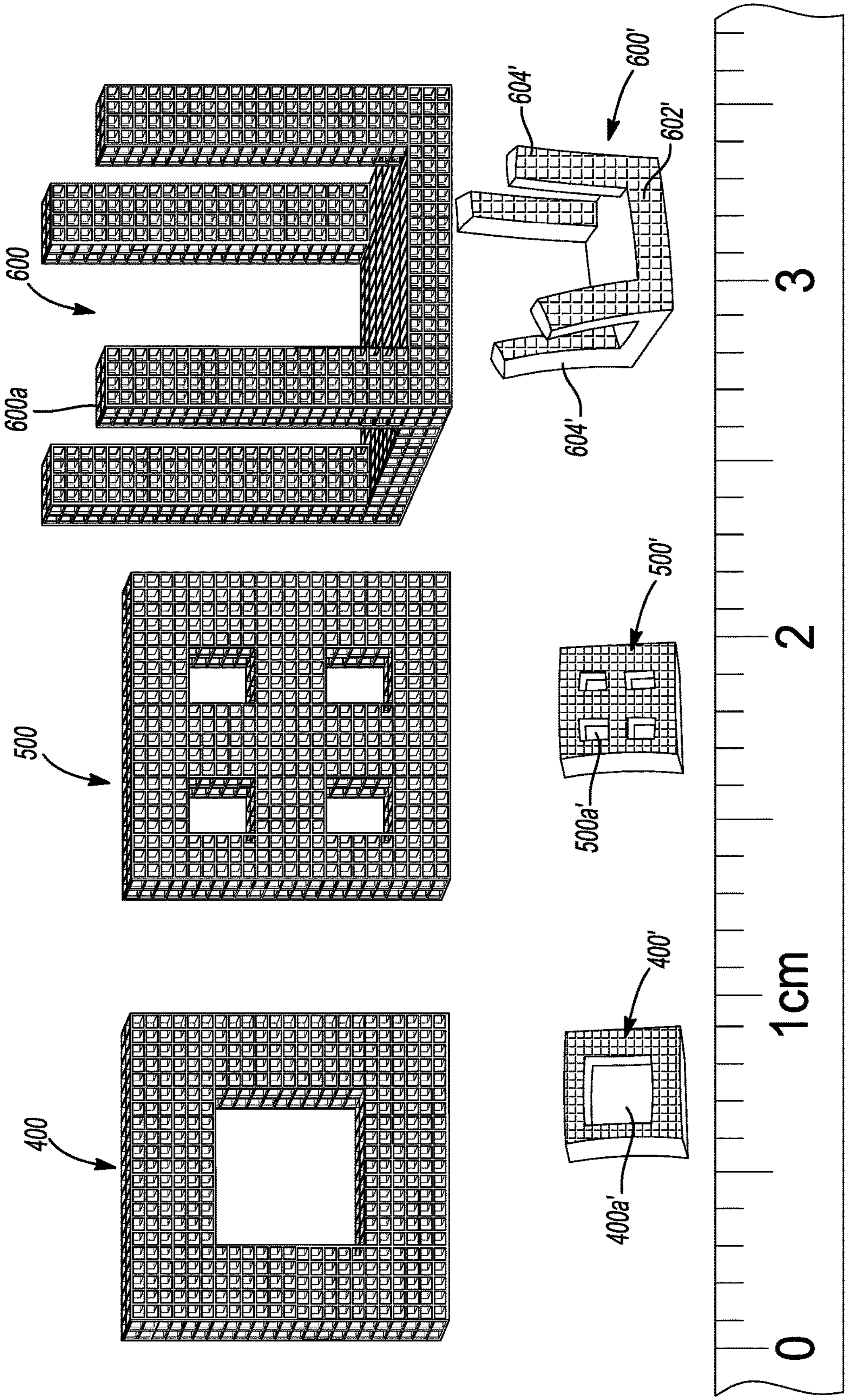
FIG. 8 shows various embodiments of different forms of lattice structures in accordance with the present disclosure, along with structures that have been carbonized to produce electrically conductive lattices.

Referring to FIG. 8, examples of lattice structures 400, 500 and 600 which have been carbonized to form carbonized lattice structures 400', 500' and 600', respectively. In practice, one will be able to carbonize virtually any structure in order to make it electrically conductive. However, there is a fair amount of shrinkage during the carbonization process, as evident from the illustrations shown in FIG. 8, so this is an important factor that needs to be taken into account when designing the structure and the sizes of the cells/pores. The carbonized lattice structures 400'-600' are carbonized by thermally treating an underlying lattice structure to reduce the structure to a carbon-based structure which then has conductivity as one of its functionalities. The carbonized lattice structure 400' can be seen to include a substantially larger central void 400*a*', while carbonized lattice structure 500' includes a plurality of smaller voids 500*a*'. Carbonized lattice structure 600' differs still further by including a base portion 602' with a plurality of spaced apart columns 604' that project outwardly from the base portion. A principal feature of the structures shown in FIG. 8 is that due to capillary forces, the liquid will be contained in the tiny pores of the lattices and not bleed out into the larger voids 400*a*' of 400', 500*a*' of 500' and the spaces between columns 604'.

One or more catalyst materials or functional coatings may also be applied to any of the lattice structures 10, 100, 200, 400-600 or 400'-600' by methods including, but not limited, to: (1) electroplating, for example using copper, gold or silver, (2) electroless plating, for example using nickel phosphide, copper, or gold, (3) atomic layer deposition, (4) chemical vapor deposition, and (5) liquid flow and evaporation, such as by flowing a solution containing a solvent through the lattice structure 100-400, followed by evaporation of the solvent.

Catalyst-coated lattice structures may also be deployed as active electrodes in electrochemical reactors or fuel cells. This use can include incorporation into standard H-cell reactor configurations, liquid-fed, vapor-fed, and liquid/ vapor-fed flow cells, or as gas diffusion electrodes (GDEs). A typical use case is the electrochemical reduction of carbon dioxide (CO2) into useful products. One example of a possible GDE setup using a lattice fluidic device may involve: (1) a cathode consisting of a lattice coated with a metallic catalyst (e.g., copper), (2) a liquid electrolyte (e.g., a hydroxide or salt solution) contained or flowing through the smaller capillary pores of the lattice, (3) the reactant gas (CO2) flowing through larger pores in the lattice, (4) a counter electrode (e.g., a similar lattice of a "mirrored" structure), (5) an anion exchange membrane, and (6) other electrochemical cell elements (e.g., reference electrode, O-rings/gaskets, tubing, electrode connections to external instrumentation, etc.). The use of lattice structures 400-600 constructed with solid-liquid-gas interfaces (catalyst-electrolyte-CO2) are expected to have especially significant commercial interest and activity.

The use of the engineered lattice structures 10/100/200/300/400'/500'/600' thus provides the ability to optimize the lattice structure by maximizing the occurrence of these triple-phase interfaces. Lattice structures 100-600 further enable shifting the overall reactor design space from a planar to a three-dimensional configuration, thereby even further increasing productivity per unit volume.

Other example implementations/applications for the lattice structures 10-600 disclosed herein include (but are not limited to): 1) A lattice fluidic device for evaporative mass transport, in which the occurrence of liquid-gas interfaces is optimized for transport of species from the liquid to the gas phase; 2) a lattice fluidic device for $CO_2$ or other gas capture, in which the occurrence of liquid-gas interfaces is optimized for efficient dissolution of the gas molecules into the liquid phase; 3) a lattice fluidic liquid-liquid extraction device, in which two liquids are brought into contact without mixing, and the species of interest is transported by chemical potential driven diffusion from one phase to the other, at maximum occurrences of liquid-liquid interfaces; 4) a lattice fluidic heat exchanger, in which two immiscible fluids of different temperatures are brought into contact within the lattice to facilitate heat transfer; 5) a lattice fluidic thermal element, in which the lattice is made of a thermally conductive material and provides heating or cooling of the fluid selectively and efficiently; or 6) as printheads for ink delivery.

Electrowetting

Electrowetting is another application of the structures described herein. Electrowetting is the modification of the wetting properties of a surface with an applied electric field. A cellular fluidics device such as that described herein can be directly fabricated from, or coated with, an electrically conductive material (e.g., metal). The surface of the conductive material can be treated with a thin layer of an electric insulator (e.g., a ceramic). One or multiple liquids can be fed into the cellular fluidics device, either passively (spontaneous uptake by capillary force) or actively (e.g., by pumping). By applying an electrical potential to the conductive material, the wetting properties (contact angle) of the liquid-solid interface change (typically from hydrophobic to hydrophilic). The combination of the adhesion force due to surface wetting and the architecture of the cellular fluidics structure enables control over the flow of the liquid through the structure. Control of fluid flow can even be exerted either in the presence or absence of gravity, making such structures especially useful in space applications.

Bubble Flow Management

Bubble flow management is still another application for the subject matter the various embodiments of the structure 10 disclosed herein. Many devices (e.g., reactors, bubble columns, etc.) involve multiphase flow of one or more gases being transported in a liquid phase. Gas bubbles can be fed into one of the embodiments of the structure of the present disclosure, or can be generated from a gas-evolving reaction in the liquid phase. Cellular fluidics can be employed to spatially and temporally direct the flow paths and frequencies or spacings of bubbles, by using architecture design, material properties, flow rates, etc. or a combination thereof. Applications include but are not limited to bubble columns, gas fed reactors, bubble-induced fluid agitation for mass transport improvement and gas product-forming.

Transpiration Cooling

Still another application for the present application is in connection with transpiration cooling. Transpiration cooling relies on heat transfer from a solid phase to a fluid that evaporates after absorbing that heat. In a heat pipe, the liquid is typically flown through a porous layer adjacent to the hot surface where it vaporizes, and is then condensed at a cold interface and recirculated back into the plow path. With cellular fluidics structures such as those described herein, the porous media can be designed as a deterministic ordered structure, facilitating the control over flow, thermal conductivity, heat transfer rates, point of phase change, etc., by using the architecture and choice of material. Applications of these concepts include but are not limited to: spacecrafts, jet and rocket engines, computer cooling systems, etc.

Engineered Living Materials

Still another application of the subject matter of the present disclosure is in connection with engineered living materials. For example, cellular fluidics can be used as scaffolds that provide transport of gases, liquids, and nutrients to living cells. Such cellular fluidic structures as described herein may be used to manipulate cells by serving as extracellular matrices (ECMs) in order to guide the growth, environmental responsiveness, or for the self-healing of hybrid cooperative materials with multicellular hierarchy. The structures described herein can be designed and functionalized to promote growth and functioning of a variety of cells, including but not limited to yeasts, fungi, embryonic plant cells, mammalian cells. In one example, a cellular fluidics device such as disclosed herein can be designed and fabricated to contain channels of higher density unit cells (i.e., smaller effective pore size). This allows flowing solutions of biopolymers such as fibronectin only through these prescribed smaller pore size channels, allowing three-dimensional patterning with the biopolymer. The biopolymer, e.g. fibronectin, promotes adhesion to the ECM, i.e. the lattice structure. Hence, the cellular fluidics device/structure can be deterministically patterned with cells. Another example may involve a cellular fluidics structure such as described herein encapsulating embryonic plant cells (seeds). Because the structure of the device is porous, gases, liquids, and dissolved nutrients can be continuously transported to the seeds, allowing growth, for example seeds growing on a tree-like cellular fluidics device.

Joining/Disjoining By Capillary Action

Figure 9:
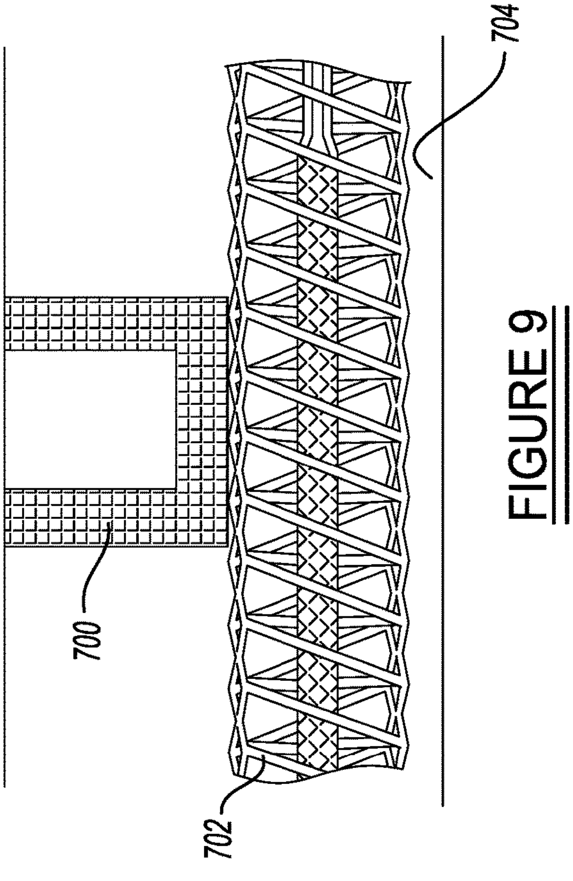
FIGS. 9-12 show how the capillary action fluid between two microlattice structures can be used as a temporary “bridge”, enabling one structure to joint to, and to lift, another structure and even to support additional weight on the structure being lifted.
Figure 10:
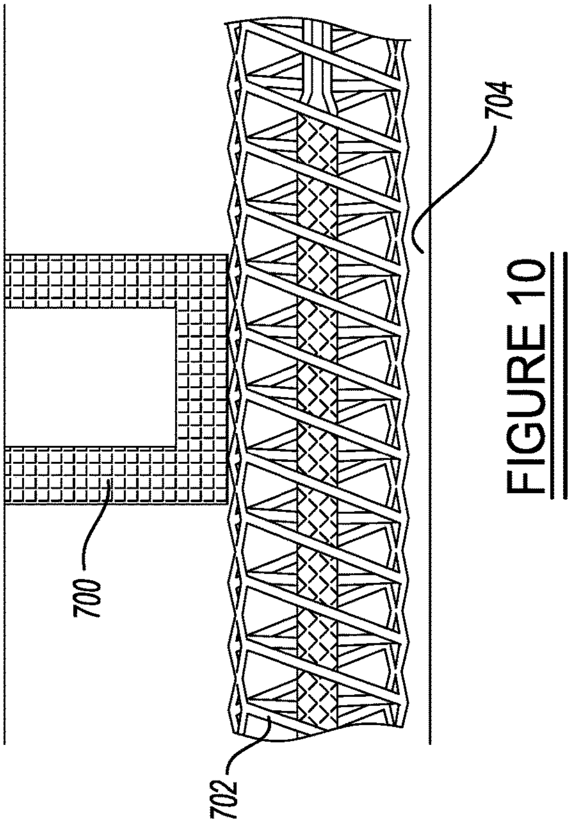
Figure 11:
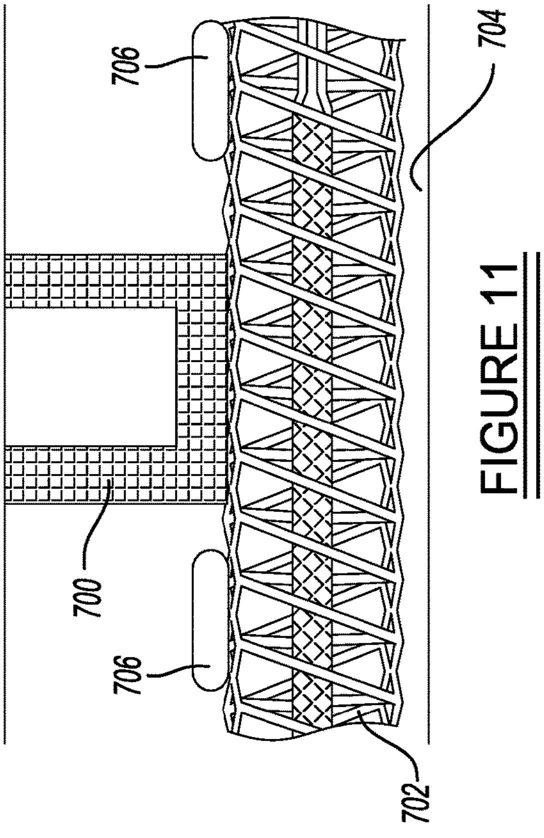
Figure 12:
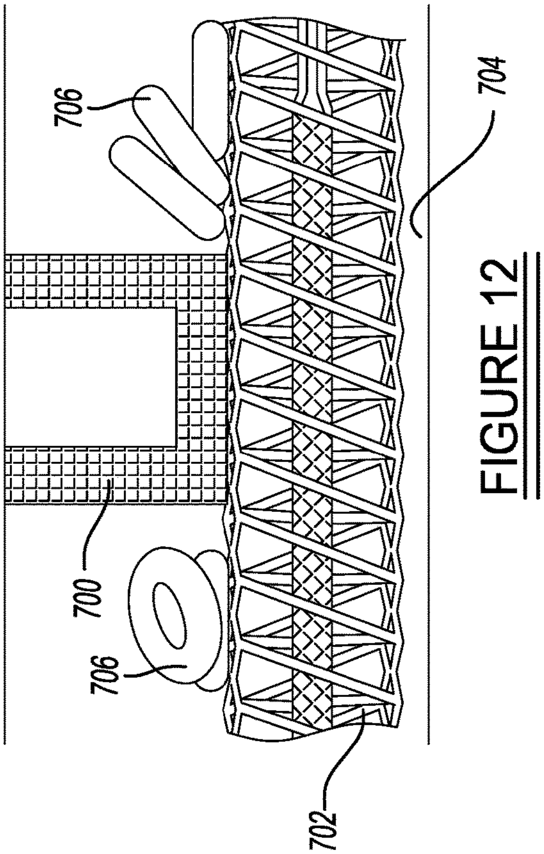

Capillary action can be used as a temporary bridge to join or disjoin elements. This "bridging" or "joining" phenomenon can be observed when filling a cellular fluidics structure with water and picking up another dry or wet structure using the capillary bridge. The fluid can be withdrawn from one structure to release from the other. This is illustrated in FIGS. 9-12. FIG. 9 shows a first "wet" structure 700, a "dry" structure 702 and a supporting surface 704. By "wet" it is meant that the wet structure 700 includes pores that are at least substantially filled with fluid. By "dry" it is meant that the structure 702 includes pores which are completely devoid of fluid, or substantially devoid of fluid. In FIG. 9 the wet structure 700 is shown just prior to making physical contact with the dry structure 702. FIG. 10 shows the wet structure having made physical contact with the dry structure 702. The capillary joining action effectively creates a suction force which joins the structures 700 and 702 when fluid from the wet structure 700 fills the pores of the mating surface of the dry structure 702. The joining force allows the wet structure 700 in this example to lift the dry structure 702 off of the support surface 704. FIGS. 11 and 12 show that the joining force is sufficiently strong to allow the capillary bridge formed between the two structures 700 and 702 to support the weight of additional elements 706. The capillary "joining" or "bridging" action may be applied in various fields, for example with soft robotics, where a "fluidic robot" can be used to "pick-and-place" dry or wet objects from one point to another. The structures can also be programmed to absorb or desorb liquid based on mechanical deformation affecting the pore size of the object.

Cellular Fluidico-Mechanical Materials

Cellular fluidics can also be used to enable selective placement of fluids in a 3D porous structure, as described previously herein. This feature can be exploited to impart additional or tunable mechanical properties to a given overall structure. For example, a lattice can be fabricated out of one material, with an architecture allowing selective fluid placement in a structurally programmed pattern. A second material, (e.g., an epoxy, molten polymer or metal, etc.), can be fed into that programmed pattern in a liquid state, and then solidified (e.g., by thermal or UV curing, drying, or other reaction) to induce a mechanical reinforcement that can be directional or isotropic. The cellular fluidics structure of the first material may be designed such that the deformation characteristic changes as a function of the second material pattern, e.g., from bend-dominated to stretch-dominated or vice versa. The second material can be fed into the structure passively (by capillary force alone) or actively (e.g., pumping) or combining both. The features (e.g., cylindrical struts or beams) of the main lattice can be hollow and contain the other material in the liquid phase, which can be programmed to be released into the pores of the lattice when a mechanical stress above a certain threshold ruptures the walls of the cylindrical beam. The main lattice can also absorb the liquid only in places where a mechanical deformation occurs. In all these cases, the solidification of the second material can be triggered by choice of material compatibility or by an automatic or manual external device (e.g., UV light). Applications of these concepts include, but are not limited to, self-healing materials, bio-inspired self-reinforcing materials and stress-responsive metamaterials.

Aerosol Collection

Figure 15A:
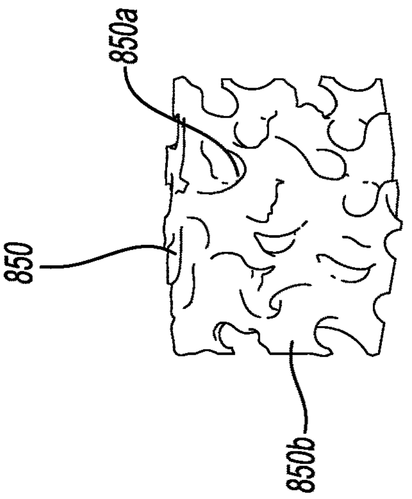
FIG. 15*a* shows one example of a wall construction for the microfluidic structure of FIGS. 13-15 that facilitates gas-to-liquid phase transfer.
Figure 15:
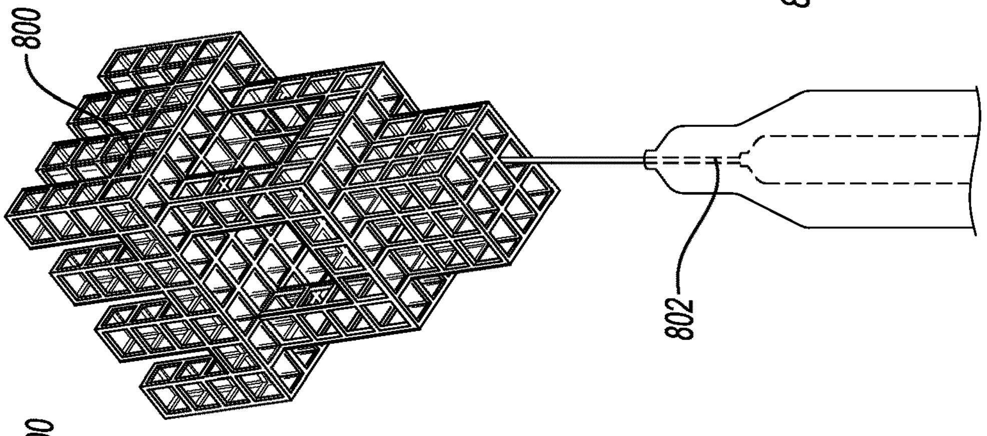
FIGS. 13-15 illustrate how cellular fluidics can be used to transport from surrounding gas phase to liquid phase, including any suspended liquid or solid species (aerosols) in the gas phase)
Figure 14:
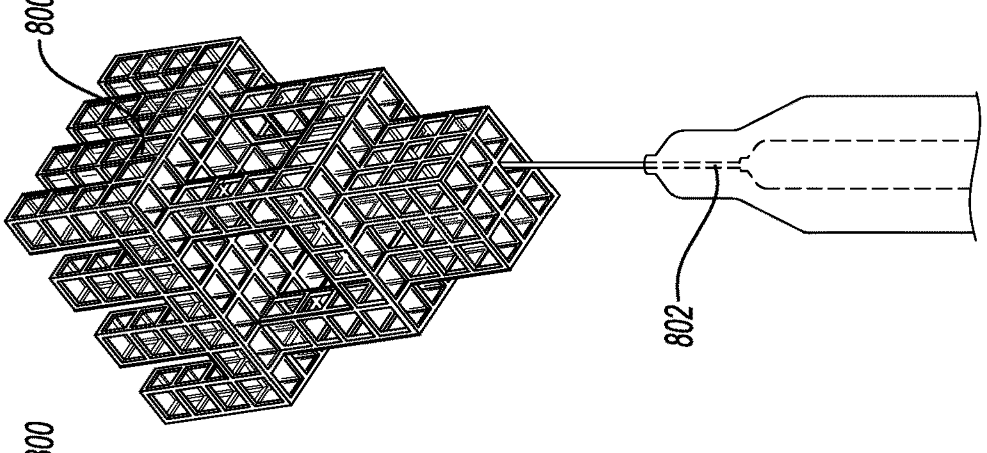
Figure 13:
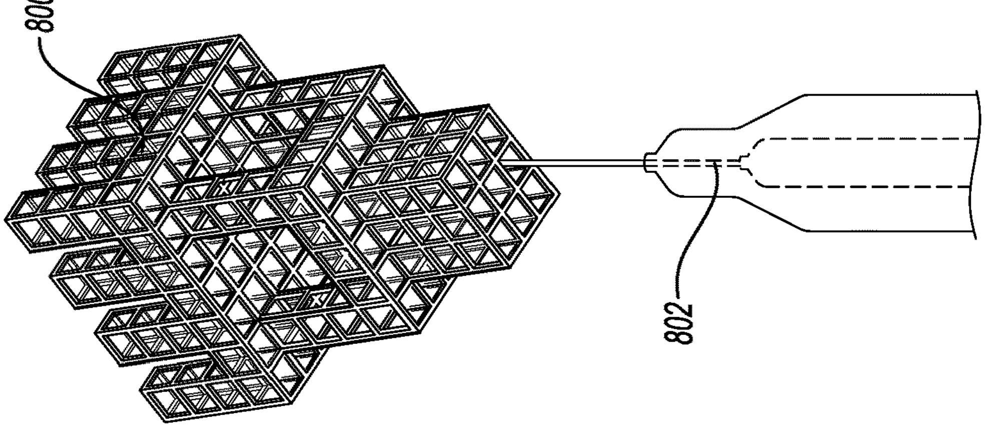

The teachings provided in the present disclosure relating to cellular fluidics devices can further be used to transport from surrounding gas phase to liquid phase, including any suspended liquid or solid species (aerosols) in the gas phase. Devices can be designed to control the flow of the gaseous phase and environmental conditions to optimize the liquid-gas interfaces to increase the efficiency of extraction of aerosols to the liquid phase contained within the lattice. The liquid phase contained within the lattice device can then be extracted along with the collected aerosols. FIGS. 13-15 illustrate sequential images of a lattice structure 800 having fluid contained in its pores, with the fluid being withdrawn using a syringe 802. The three dimensional shape or configuration of the lattice structure 800 is not critical; it need only have a construction of a plurality of pores as described herein in connection with FIGS. 1-8.

Extraction efficiency can be enhanced by using local temperature or concentration gradients, or engineered flow fields to increase the impingement of aerosols onto the liquid-gas interfaces or through condensation of suspended particles into the liquid phase. Furthermore, flow paths can be engineered to enable efficient recovery of the liquid contained in the lattice. For example, FIG. 15*a* shows one example of a 3D, additively manufacturing printed, periodic wall construction 850, in this example a Gyroid, which may be used for forming a microfluidic lattice structure such as that shown in FIGS. 13-15, which enables transfer of chemical species from one phase to another to occur (e.g., absorption of gas molecules or aerosolized liquid droplets into a continuous liquid phase, or extraction of a substance from one liquid to another). Channels 850*a* formed between wall portions 850*b* allow flow of one fluid (e.g., a gas or aerosol) therethrough, which may be absorbed into portions 850*b* of the wall construction 850.

Figure 15B:
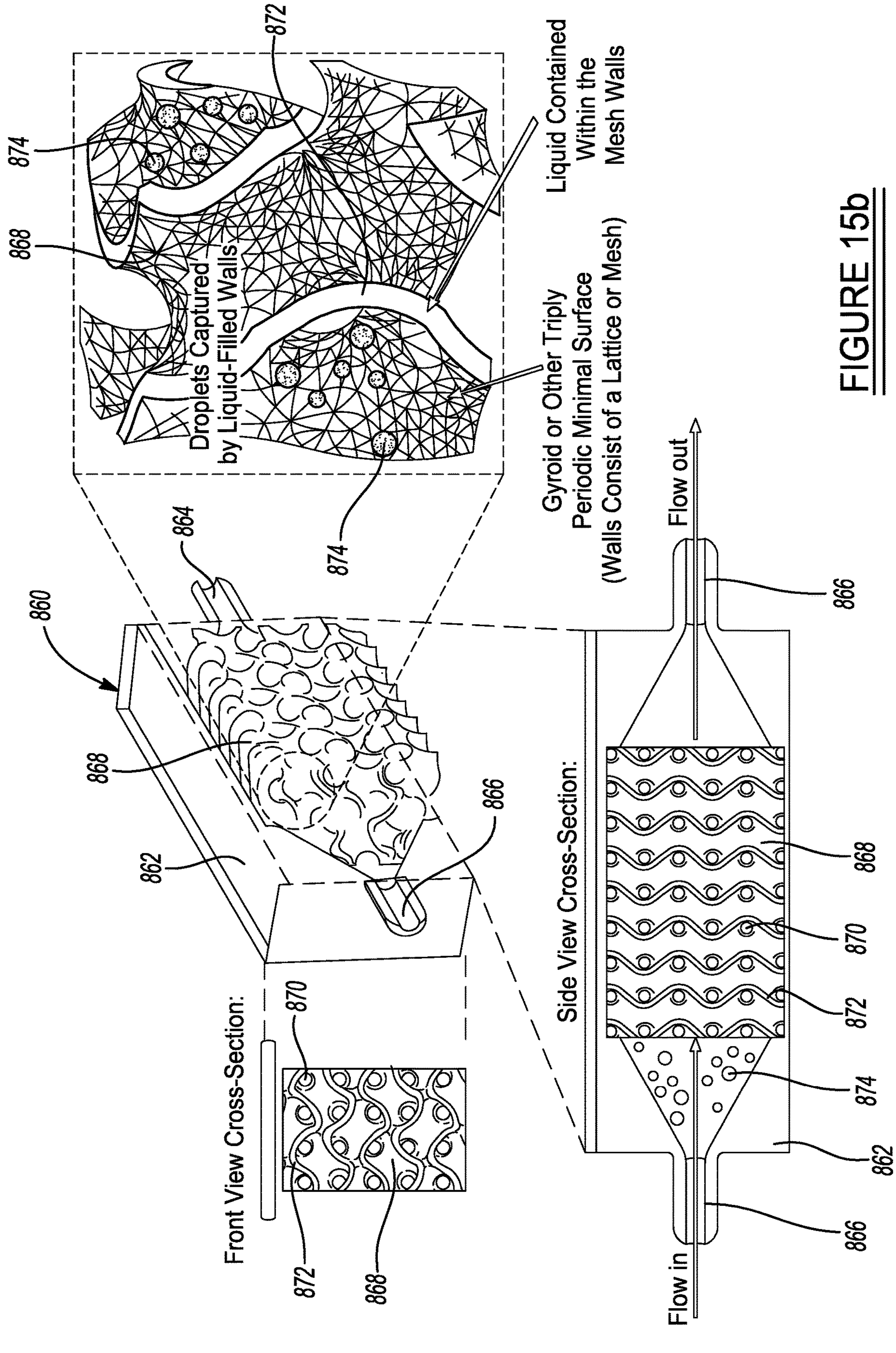
FIG. 15*b* shows one embodiment of a structure for capturing aerosol particles using the 3D AM printed periodic Gyroid structure of FIG. 15*a;*

FIG. 15*b* shows one specific embodiment of a structure 860 for capturing aerosols. In this example the structure 860 includes a housing 862, which may be made from any suitable material (e.g., plastic, stainless steel, etc.), which has an inlet port 864 and an outlet port 866. The housing 862 contains a quantity of the 3D, periodic, additively manufactured material 868 therein. Open channels 870 extend through the material 868 and are separated by wall structures 872. The wall structures 872 are composed of a mesh or lattice, the pores of which can contain a liquid while allowing gases to flow through the open channels 870. As aerosolized liquid droplets 874 flow into the inlet port 864 they impact different wall portions 872 and are absorbed by the liquid contained within the wall portions 872.

Evaporative Concentration Desalination

Gas-liquid interfaces can also be optimized to control the rate of evaporation at different regions within the device to modify local concentrations of dissolved species. For example, this method could be used to remove solvent and concentrate non-volatile species. An example application may include solar desalination devices, where salt water is continuously flowing to the gas-liquid interfaces where evaporation occurs, and the precipitated salt can be collected through programmed paths and/or by mechanical agitation.

World-to-Chip

Lattice surface properties and geometries can be designed to hold discrete liquid quantities which are readily accessible through gas-liquid interfaces. This is illustrated in FIGS. 16*a*-16*f*. In this embodiment, a lattice structure 900 is formed which has a plurality of discrete fluid pockets 900*a*, 900*b*, 900*c* and 900*d*, each forming a column, and arranged in series, one adjacent another, along a common longitudinal channel 901. A highly enlarged view of a portion of the lattice structure 900 is shown in FIG. 16*g*. In FIG. 16*g* the cells 900*a*-900*d* are formed adjacent to one another and each defined by common wall portions 904, which in this example define each cell 900*a*-900*d* as a square cubic structure forming a cell size of about 1 mm-2 mm, and in this example a cell of about 1.5 mm in length and width. However, it will be appreciated this is but one example, the cells 900*a*-900*d* could be formed in a wide range of other shapes and with widely varying dimensions to meet the needs of a given application.

FIG. 16*g* also shows how flow of a liquid actively pumped into the structure can be guided in the desired direction along connected unit cells 900*a*-900*d* and prevent the liquid from leaking out of the bottom open sides of the cells. This can be facilitated by controlling the diameter of each strut 904*a*1 used to help form each wall portion 904*a*, as well as a radius of the curvature of each wall segment 904*a*2 used to help form each wall portion 904. Essentially, decreasing the strut 904*a*1 diameter from left-to-right in the figure, while also increasing the wall 904*a*2 radius from left-to-right across the length of the structure 900, will cause in a lower pressure drop across the gas-liquid interface for each subsequent cell 900*a*-900*d* when moving left-to-right across the structure 900.

FIG. 16*g*, graph 905, illustrates that in this example of the structure 900, in which the strut thickness decreases and resulting pore size increases along the structure 900 from left to right in the Figure. Accordingly, the pressure drop across the gas-liquid interface also decreases with each subsequent unit cell (from left to right), which results in a liquid front 906 in the side view simulations 908-912 of the structure 900 moving from left-to-right through the central channel 901 of the structure. Decreasing the strut size from left to right slightly alters the pressure across the interface for each consecutive unit cell. Larger diameter struts decrease the effective pore size and the radius of curvature of the gas-liquid interface (R). Hence, from the Young-Laplace equation ($\Delta P=2\gamma/R$, where $\gamma$ is the surface tension), the pressure drop across the interface is higher at the cell entrance than the exit and the liquid preferentially moves in the direction of decreasing pressure.

Figure 16A:
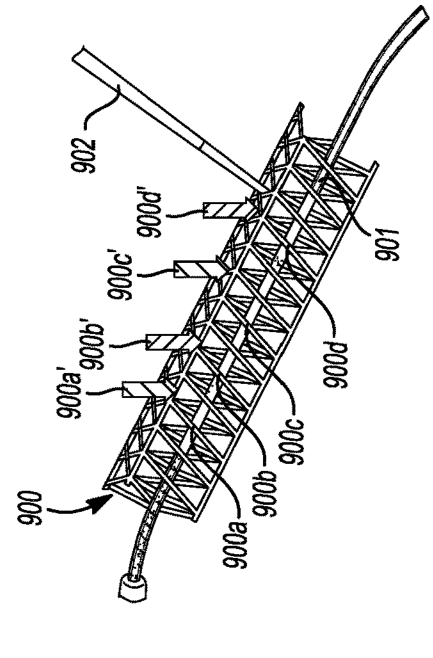
FIGS. 16*a*-16*g* show a lattice structure in accordance with an embodiment of the present disclosure which is designed to hold discrete fluid quantities in “pockets” which are readily accessible through gas-liquid interfaces using well known fluid delivery systems.
Figure 16B:
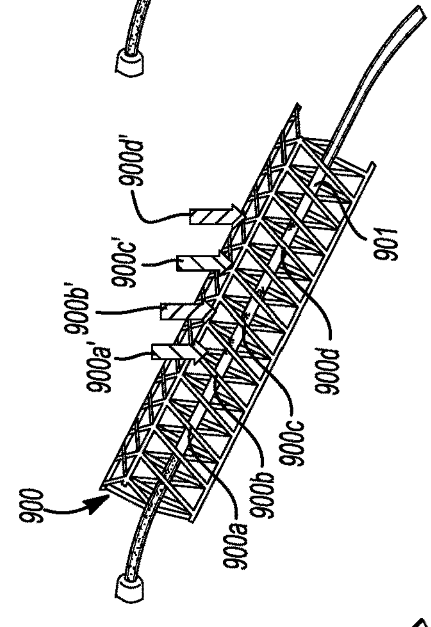
Figure 16C:
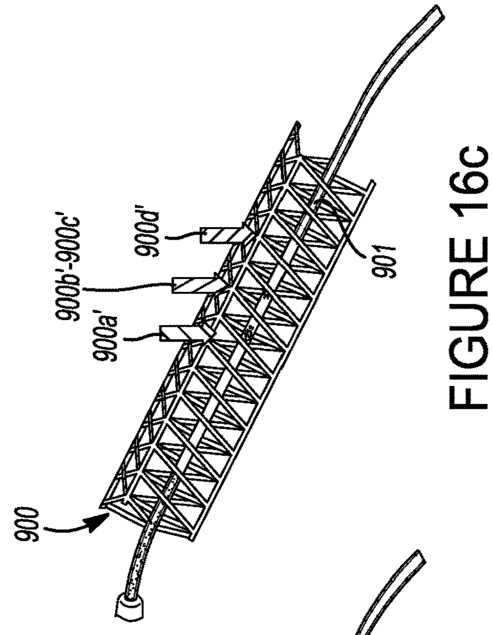
Figure 16D:
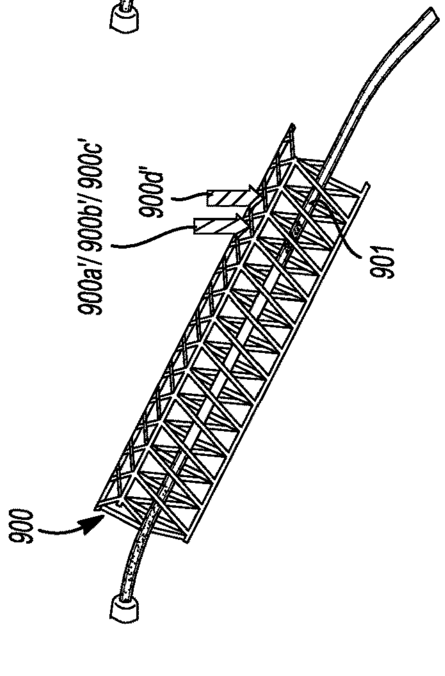
Figure 16E:
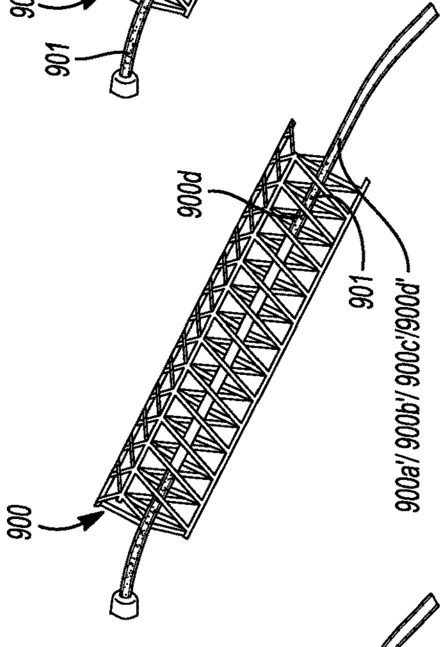
Figure 16F:
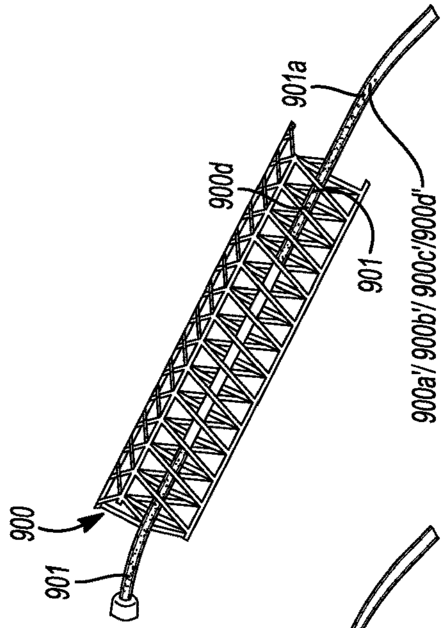
Figure 16G:
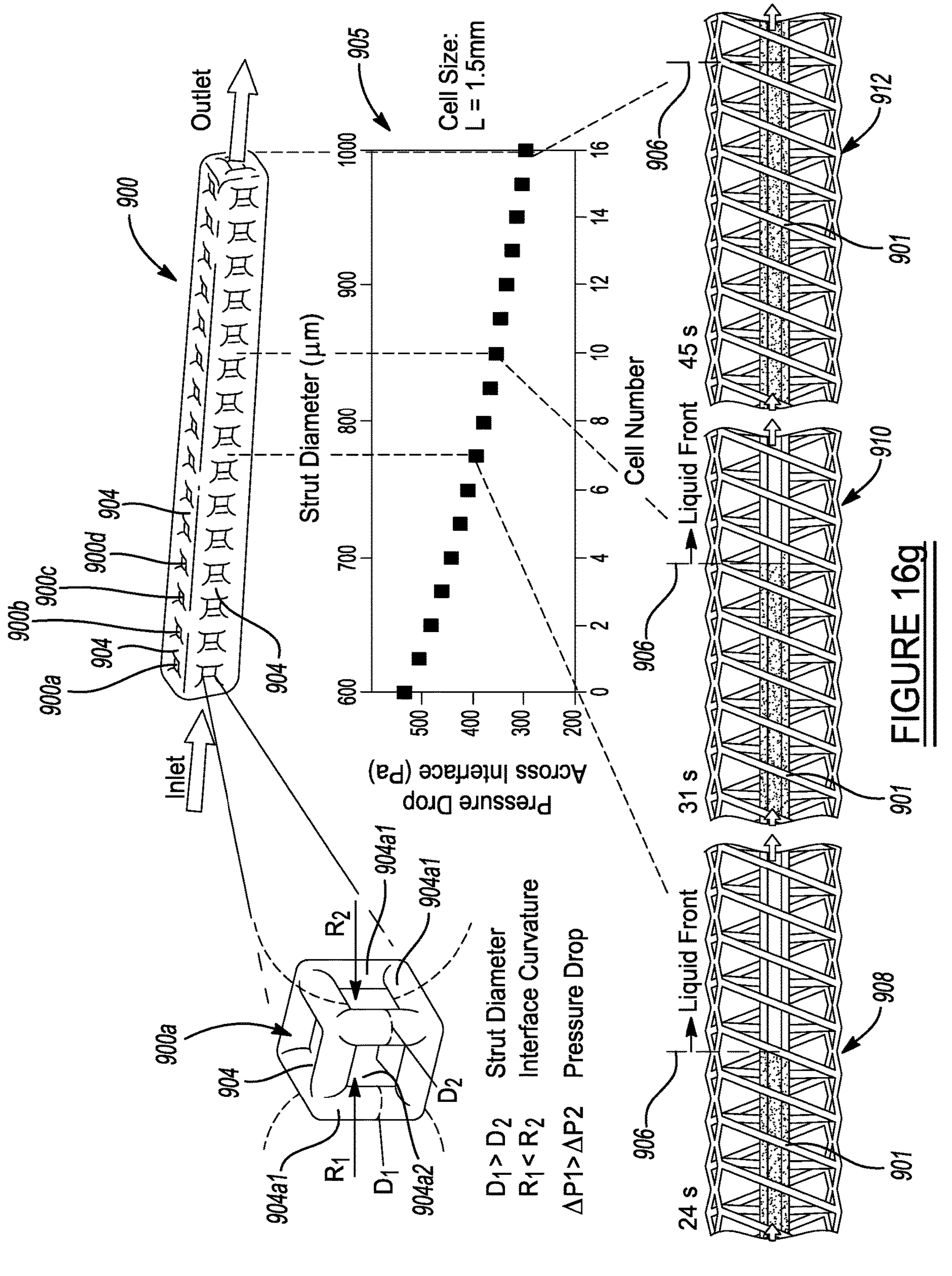

With further reference to FIGS. 16*a*-16*f*, the fluid pockets 900*a*-900*d* are similar to well plates frequently used in pharmaceutical applications. The fluid pockets 900*a*-900*d* can be easily accessed using standard fluid delivery systems such as pipettes. Like traditional well plates, discrete fluid pockets can be delineated from each other by adjacent cells filled with immiscible fluids, gas phase, or by otherwise modifying the capillary forces to confine fluids of interest. However, fluid pockets could be also connected directly to adjacent cells and flow paths within the device generating functionality not accessible to well plates, which is what is shown in the lattice structure 900 with longitudinal channel 901 being in communication with the fluid pockets 900*a*-900*d*. FIG. 16*a* shows droplets 900*a*'-900*d*' of different fluid reagents being loaded into each of the separate fluid pockets 900*a*-900*d* the lattice structure 900, for example using a pipette 902 (or optionally by a liquid handling robot). Flow is then initiated left to right in FIGS. 16*b*-16*f*, in this case using a liquid which is immiscible to the liquid of 900*a*'-900*d*', which generates an engineered flow through the longitudinal channel 901 within the lattice structure 900 to combine and mix the different reagents 900*a*'-900*d*'. The fully mixed reagents exit a small conduit 901*a* in communication with the longitudinal channel 901.

Figure 17A:
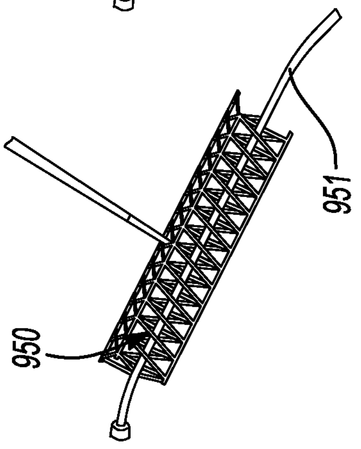
FIGS. 17*a*-17*h* illustrate a fluidic lattice structure in accordance with another embodiment of the present disclosure which allows sequencing of different fluids (e.g., different reagents) into specific cells of the structure, where the different fluids can be held in the specific cells without commingling, and then the different fluids are sequentially withdrawn.
Figure 17B:
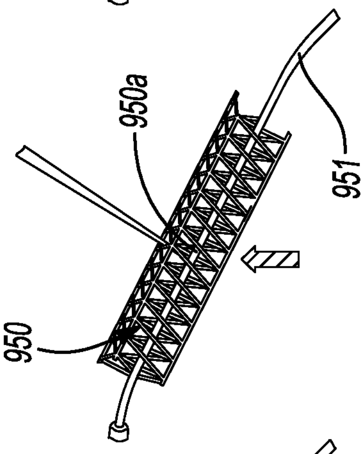
Figure 17C:
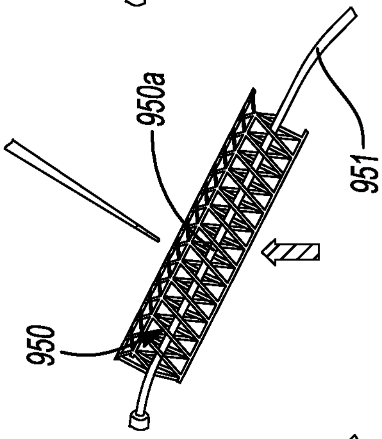
Figure 17D:
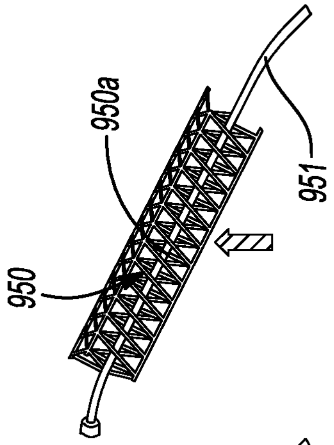
Figure 17E:
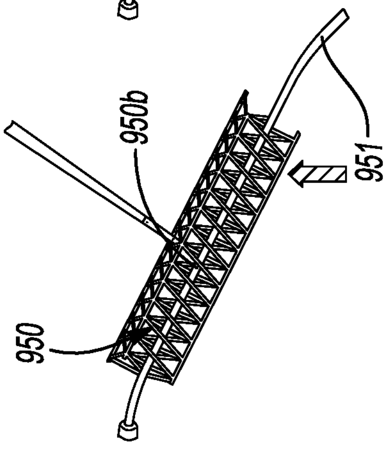
Figure 17F:
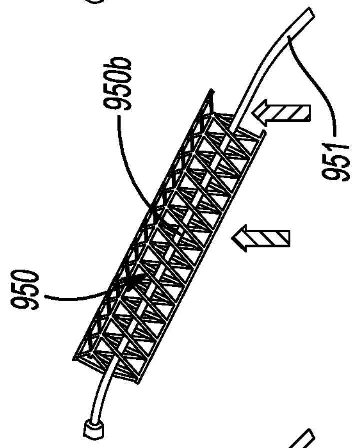
Figure 17G:
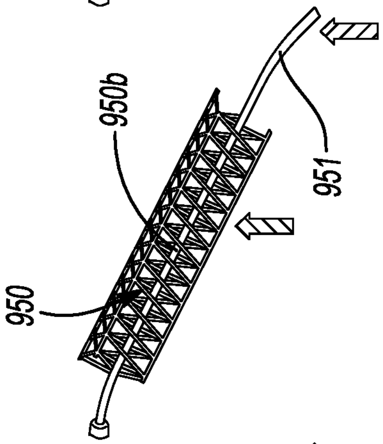
Figure 17H:
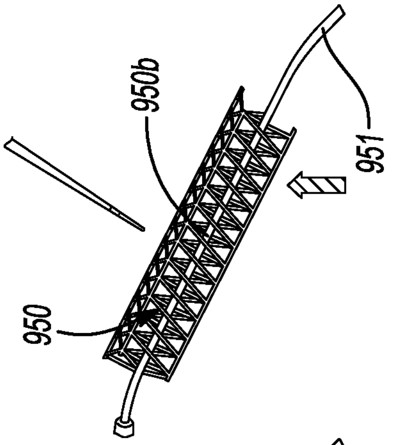

FIGS. 17*a*-17*f* illustrate fluidic lattice structure 950. In this embodiment fluids, for example reagents 950*a* and 950*b*, may be loaded into the lattice structure 950 in a specific sequence, and withdrawn in a specific sequence. The lattice in FIG. 17*a* is filled with a liquid which is immiscible with the reagents 950*a* and 950*b*. The FIGS. 17*b*-17*d* show a pipette being used to load a first reagent 950*a* into one cell of the structure 950 and then moving through a common central longitudinal channel 951 as it is being extracted, due to continuous flow of the immiscible fluid from left to right (FIGS. 17*e* and 17*f*). FIGS. 17*e*-17*g* also show a second reagent 950*b* being injected into a cell of the lattice structure 950 (FIG. 17*e*), being held in its associated cell (FIG. 17*f*), and then in the process of being extracted through the common longitudinal channel 951 (FIGS. 17*h*). Contrary to the example presented in FIGS. 16*a*-16*f*, the flow is tuned such that the added reagents 950*a* and 950*b* do not coalesce. Each individual droplet (950*a* and 950*b*) is separated by an immiscible continuous fluid. These sequenced reagents can be extracted into the closed channel 951. By coupling this method with liquid handling instrumentation large numbers of reagents can be loaded and sequenced into closed channels.

Engineered Living Materials

Figure 18:
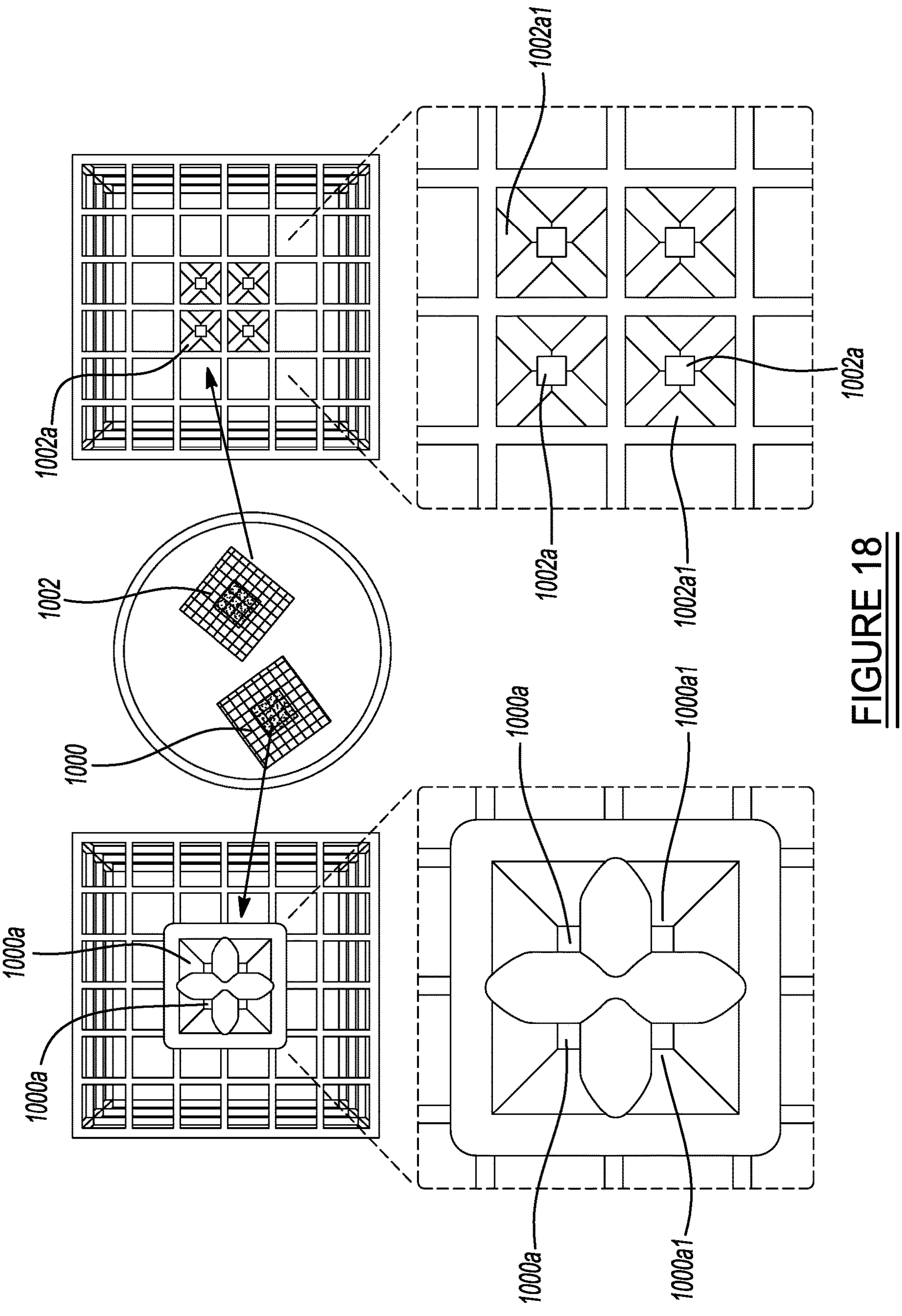
FIG. 18 illustrates how a lattice structure can be designed and fabricated to contain channels of higher density unit cells (i.e., smaller effective pore size), which allows flowing solutions of biopolymers such as fibronectin only through these prescribed smaller pore size channels, allowing three-dimensional patterning with the biopolymer.

Cellular fluidics lattice structures can be used as scaffolds that provide transport of gases, liquids, and nutrients to living cells. This is illustrated in FIG. 18. The scaffolds of the cellular fluidics structures 1000 or 1002 can be used to manipulate cells by serving as extracellular matrices (ECMs) in order to guide the growth, environmental responsiveness, self-healing of hybrid cooperative materials with multicellular hierarchy. Cellular fluidics can be designed and functionalized to promote growth and functioning of a variety of cells, including but not limited to yeasts, fungi, embryonic plant cells, mammalian cells. In the example shown in FIG. 18, the cellular fluidics structures 1000 and 1002 can be designed and fabricated to contain channels of higher density unit cells (i.e., smaller effective pore size), as indicated at 1000*a* for structure 1000, or transverse portions 1002*a* as shown for structure 1002. This allows flowing solutions of biopolymers such as fibronectin only through these prescribed smaller pore size channels, allowing three-dimensional patterning with the biopolymer. FIG. 18 shows cells 1000*a*1 having attached to the fibronectin in the lower two, highly enlarged illustrations of FIG. 18, while structure 1002 is shown with cells 1002*a*1 having attached to the structure. The biopolymer, e.g., fibronectin, promotes adhesion to the ECM, i.e., the lattice structure. Hence, the cellular fluidics structure 1000 or 1002 can be deterministically patterned with cells. One specific example may include a cellular fluidic structure that is patterned with human umbilical vein endothelial cells (HUVECs).

Figure 19A:
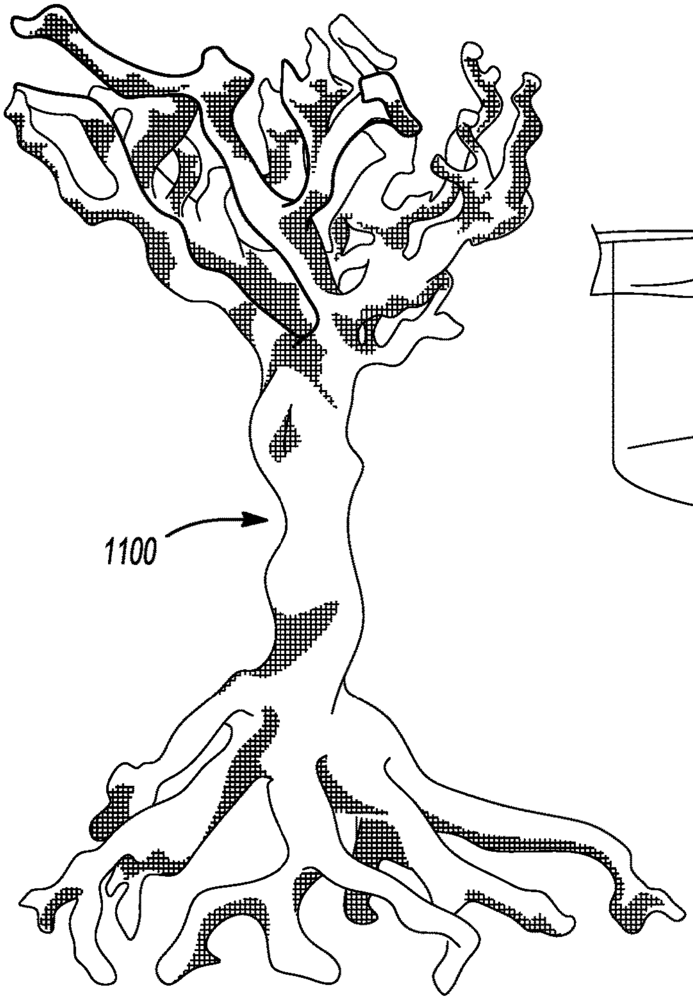
FIGS. 19*a*-19*c* illustrate another embodiment of the present disclosure in which a “lattice tree” is constructed to facilitate the growing of plants through capillary action of feeding water to the seeds placed at an upper region of the lattice tree.
Figure 19B:
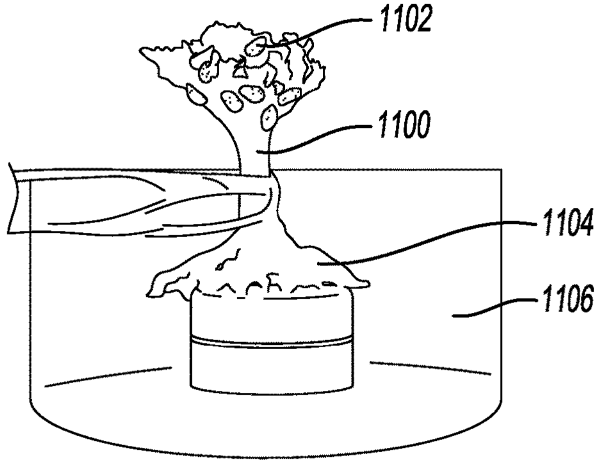
Figure 19C:
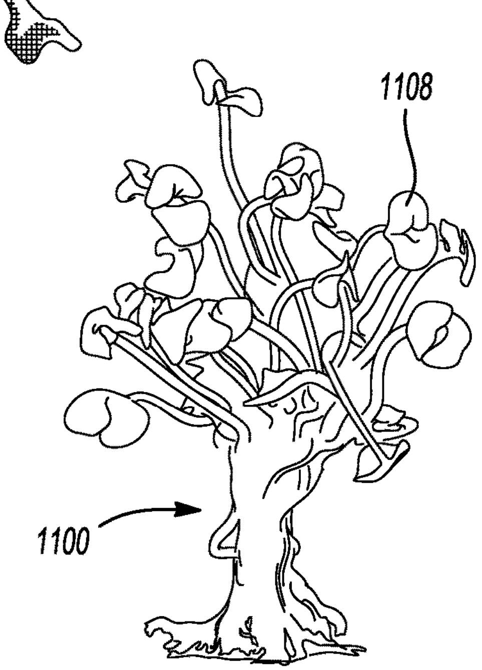

Another example of an application of the present disclosure involves having a cellular fluidics lattice structure encapsulating embryonic plant cells (seeds). This is shown in FIGS. 19*a*-19*c*. FIG. 19*a* shows a lattice "tree" 1100 formed in accordance with the teachings presented herein. Because the lattice tree 1100 is porous, gases, liquids, and dissolved nutrients can be continuously transported to the seeds, allowing growth. In FIG. 19*b* chia seeds 1102 are placed on top of the lattice tree 1100. The lattice tree 1100 has "roots" 1104 which are submerged in a sealed water reservoir 1106. The seeds 1102 will only sprout, as shown in FIG. 19*c*, and indicated at 1108, if they are watered. Because the lattice tree 1100 is porous, water is continuously delivered to the seeds 1102 via capillary action through the pores of the lattice tree, mimicking the functioning of real plants.

The systems and methods disclosed herein are therefore expected to find utility in a wide range of devices. Such devices may include devices in which chemical reactions, heat and mass transport at interfaces are important, such as electrochemical devices, thermochemical devices, bio-reactor devices, batteries, fuel cells, or a wide range of other applications as noted herein. Specific applications may include, but are not limited to, electrochemical reaction catalysis at gas-liquid-solid interfaces, liquid-liquid interface extraction, microfluidic heat transfer, sensing platforms, controlled evaporation devices, and selective coating technologies.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. An engineered, additively manufactured, integrated microfluidic cellular lattice apparatus, the apparatus comprising:

a plurality of tessellated, three dimensional cells having a plurality of interconnected elements to define repeating, connected but distinct volumes one next to another, each one of said plurality of tessellated, three dimensional cells having a three-dimensional volume configured to receive a quantity of a fluid at a first end thereof and to hold the quantity of fluid separate from other ones of the plurality of tessellated, three dimensional cells;

a common structural channel connected to a subplurality of the plurality of interconnected elements and fluidically connected to the plurality of tessellated, three-dimensional cells at a second end of each of the plurality of tessellated, three-dimensional cells, the common structural channel providing a fluid flow pathway to channel fluid flow perpendicularly to a flow of fluid through the plurality of tessellated, three dimensional cells to channel fluid, out from the plurality of tessellated, three dimensional cells;

each one of the plurality of tessellated, three dimensional cells being directly interconnected to another one of the plurality of tessellated, three dimensional cells and having pores and the plurality of tessellated, three dimensional cells being open at the first ends, and the plurality of tessellated, three dimensional cells fluidically connected at the second ends to the common structural channel; and each one of the plurality of tessellated, three dimensional cells is configured to accept the fluid at said first end and operating to channel the fluid into the common structural channel and to hold the fluid in the common structural channel.

2. The apparatus of claim 1, wherein the plurality of tessellated, three dimensional cells are directly connected to one another by wall portions of common ones of said plurality of interconnected elements, which form common wall portions.

3. The apparatus of claim 2, wherein the plurality of tessellated, three dimensional cells are connected thereby forming a contiguous arrangement.

4. The apparatus of claim 1, wherein each one of the plurality of interconnected elements of the plurality of tessellated, three dimensional cells comprises a strut, and wherein the struts are interconnected.

5. The apparatus of claim 4, wherein the interconnected struts have differing diameters configured to provide a selective pressure drop across a length of the apparatus, to cause a fluid contained in the plurality of tessellated, three dimensional cells to flow in a predetermined direction through the common structural channel of the additively manufactured, integrated microfluidic cellular apparatus.

6. The apparatus of claim 2, wherein the common wall segments portions of the plurality of tessellated, three dimensional cells have differing radiuses of curvature configured to provide a selective pressure drop across a length of the apparatus, to thus cause fluid contained in the plurality of tessellated, three dimensional cells of the additively manufactured, integrated microfluidic cellular apparatus to flow through the plurality of tessellated, three dimensional cells in a predetermined direction.

7. A method for forming an engineered, additively manufactured, microfluidic cellular structure for selectively channeling a fluid deposited in the structure, the method comprising:

forming a plurality of interconnected tessellated, three dimensional cells to create voids therewithin, the voids configured to each receive a quantity of the fluid therein at a first end of each of the voids;

further forming the plurality of interconnected tessellated, three dimensional cells with a plurality of interconnected struts and a plurality of wall segments connected to select ones of the plurality of struts, such that each one of said plurality of tessellated, three dimensional cells defines one of the voids;

further forming each one of the plurality of tessellated, three dimensional cells such that at least one of:

the plurality of interconnected struts have differing diameters; or the plurality of wall segments have differing radiuses of curvature; and further forming the plurality of interconnected tessellated, three dimensional cells such that at least one of the differing diameters or the differing radiuses of curvature are arranged within the structure to cause a pressure drop between the first end of each of the voids and a second portion of the engineered, additively manufactured, microfluidic cellular structure.

8. The method of claim 7, wherein each said cell of the plurality of interconnected tessellated, three dimensional cells has a plurality of interconnected struts having differing diameters and a plurality of wall segments having differing radiuses of curvature.

9. The method of claim 7, further comprising providing an elongated channel fluidically connected to at least select ones of the plurality of interconnected tessellated, three dimensional cells, to enable the quantity of fluid to be moved therethrough from the first end of each of the voids to the second portion of the engineered, additively manufactured, microfluidic cellular structure.

* * * * *